(12) United States Patent
Ogiwara et al.

(10) Patent No.: US 9,928,903 B2
(45) Date of Patent: Mar. 27, 2018

(54) SEMICONDUCTOR STORAGE DEVICE WITH VOLTAGE GENERATOR WHICH GENERATES VOLTAGES AND CURRENTS FOR READ AND WRITE OPERATIONS

(71) Applicant: TOSHIBA MEMORY CORPORATION, Minato-ku, Tokyo (JP)

(72) Inventors: Ryu Ogiwara, Yokohama Kanagawa (JP); Daisaburo Takashima, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/248,216

(22) Filed: Aug. 26, 2016

(65) Prior Publication Data
US 2016/0365143 A1    Dec. 15, 2016

Related U.S. Application Data

(63) Continuation-in-part of application No. 14/848,279, filed on Sep. 8, 2015, now abandoned.
(Continued)

(51) Int. Cl.
*G11C 13/00* (2006.01)
*G11C 7/04* (2006.01)
*G11C 11/16* (2006.01)

(52) U.S. Cl.
CPC ............ *G11C 13/0004* (2013.01); *G11C 7/04* (2013.01); *G11C 13/0026* (2013.01);
(Continued)

(58) Field of Classification Search
CPC ............ G11C 13/0004; G11C 13/0069; G11C 11/1675; G11C 13/0026; G11C 7/04;
(Continued)

(56) References Cited

U.S. PATENT DOCUMENTS 7,315,482 B2   1/2008   Lin et al.
7,864,614 B2   1/2011   Midorikawa et al.
(Continued)

FOREIGN PATENT DOCUMENTS

JP    2011081899 A    4/2011

OTHER PUBLICATIONS

Hironori Banba, et al., "A CMOS Bandgap Reference Circuit with Sub-1-V Operation", IEEE Journal of Solid-State Circuits, vol. 34, No. 5, May 1999, pp. 670-674.
(Continued)

*Primary Examiner* — David Lam
(74) *Attorney, Agent, or Firm* — Holtz Holtz & Volek PC

(57) ABSTRACT

According to one embodiment, a semiconductor storage device includes: a memory cell including a variable resistance element; a bit line coupled to the memory cell; and a first circuit applying a first voltage to the bit line in a write operation for the memory cell. When a temperature of the variable resistance element is lower than or equal to a first temperature, a temperature coefficient of the first voltage is 0. When the temperature of the variable resistance element is higher than the first temperature, the temperature coefficient of the first voltage is negative.

35 Claims, 11 Drawing Sheets

Related U.S. Application Data

(60) Provisional application No. 62/140,059, filed on Mar. 30, 2015.

(52) U.S. Cl.
CPC ...... *G11C 13/0038* (2013.01); *G11C 13/0069* (2013.01); *G11C 11/1655* (2013.01); *G11C 11/1675* (2013.01); *G11C 11/1697* (2013.01); *G11C 13/004* (2013.01); *G11C 2013/009* (2013.01); *G11C 2013/0054* (2013.01); *G11C 2213/72* (2013.01)

(58) Field of Classification Search
CPC ............ G11C 13/0038; G11C 2213/72; G11C 11/1697; G11C 2013/009; G11C 11/1655; G11C 2013/0054; G11C 13/004
USPC .......................................... 365/148, 211, 207
See application file for complete search history.

(56) References Cited

U.S. PATENT DOCUMENTS

| | | | |
|---|---|---|---|
| 8,031,511 B2* | 10/2011 | Osada | G11C 13/0004 365/148 |
| 8,422,280 B2 | 4/2013 | Choi et al. | |
| 8,437,171 B1 | 5/2013 | Gilbert | |
| 9,082,970 B2* | 7/2015 | Soeya | H01L 45/144 |
| 2005/0041464 A1 | 2/2005 | Cho et al. | |
| 2005/0254294 A1 | 11/2005 | Iwata | |
| 2006/0153277 A1* | 7/2006 | Yoshida | G01K 3/005 374/178 |
| 2007/0047365 A1 | 3/2007 | Yoshinaga et al. | |
| 2007/0241736 A1 | 10/2007 | Ogiwara et al. | |
| 2009/0073753 A1 | 3/2009 | Osada et al. | |
| 2009/0108919 A1 | 4/2009 | Ogiwara et al. | |
| 2015/0092497 A1* | 4/2015 | Tsai | G11C 5/147 365/185.21 |

OTHER PUBLICATIONS

J. Tominaga, et al., "The first Principle Computer Simulation and Real Device Characteristics of Superlattice Phase-Change Memory", IEDM10-528-531, 2010, pp. 22.3.1-22.3.4.

Junji Tominaga, et al., "Electrical-field induced giant magnetoresistivity in (non-magnetic) phase change films", Applied Physics Letters 99, 2011, pp. 152105-1 to 152105-3.

Koh Johguchi, et al., "Reliable, Low-Power Super-Lattice Phase-Change Memory without Melting and Write-Pulse Down Slope", IEEE, Reliability Physics Symposium, 2013, pp. MY.5.1-MY.5.4.

N. Takaura, et al., "Charge Injection Super-Lattice Phase Change Memory for Low Power and High Density Storage Device Applications", 2013 Symposium on VLSI Technology Digest of Technical Papers, 9-1, pp. T130 and T131.

S. Kato, et al., "Carrier Injection Induced Switching of Supperlattice GeTe/Sb2Te3 Phase Change Memories", Extended Abstracts of the 2013 International Conference on Solid State Devices and Materials, Fukuoka, 2013, A-3-1, pp. 544 and 545.

Toru Egami, et al., "Investigation of multi-level-cell and SET operations on super-lattice phase change memories", Japanese Journal of Applied Physics, 53, 2014, pp. 04ED02-1 to 04ED02-8.

Toru Tanzawa, "On-chip High-Voltage Generator Design", Generator Design, Springer Science & Business Media, 2011, pp. 150-153.

\* cited by examiner

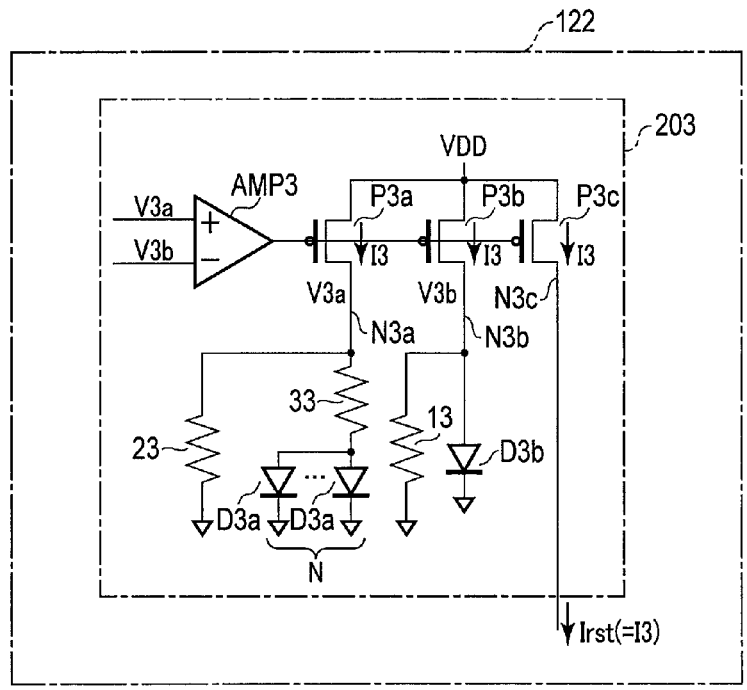
F I G. 6
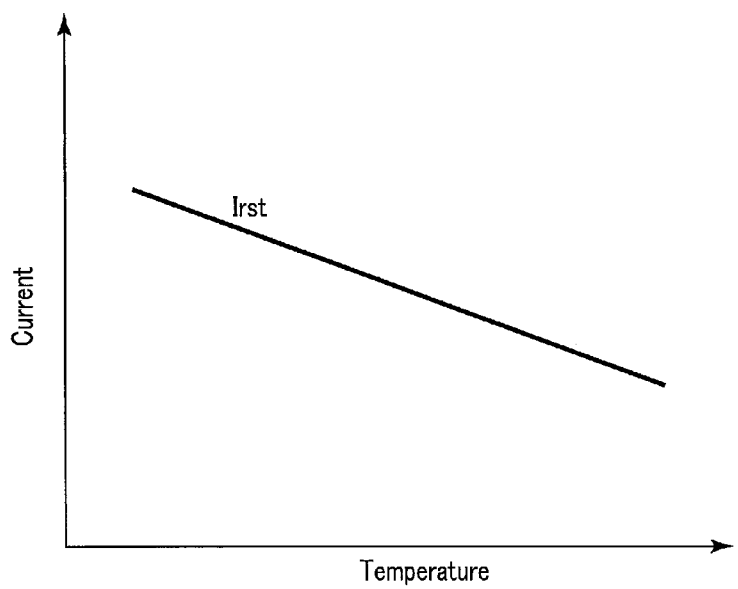
F I G. 7

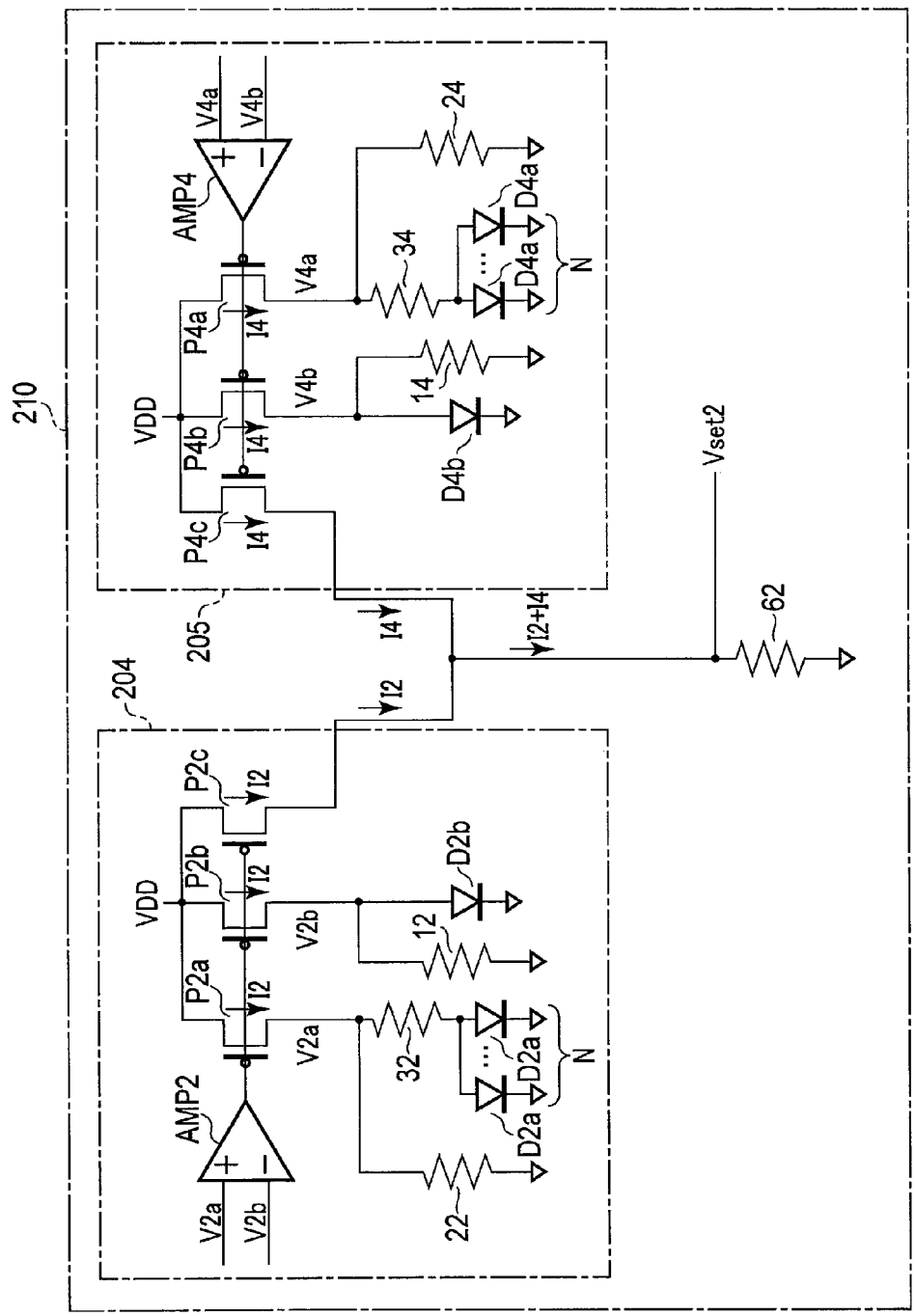
F I G. 8

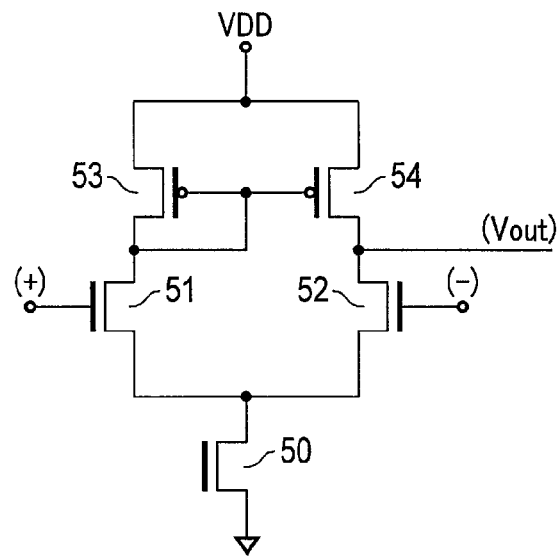
F I G. 15
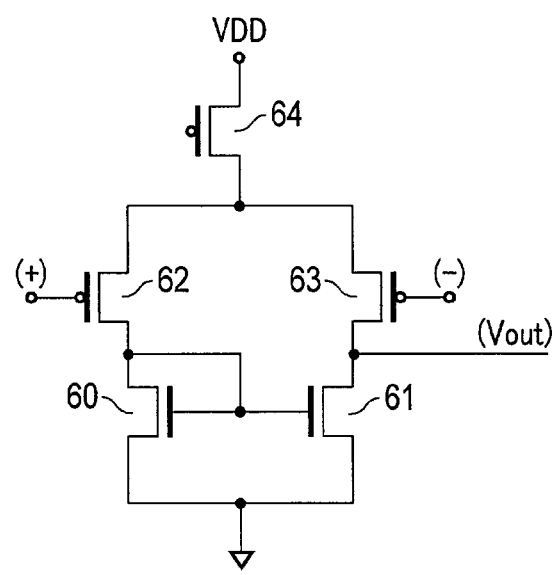
F I G. 16

SEMICONDUCTOR STORAGE DEVICE WITH VOLTAGE GENERATOR WHICH GENERATES VOLTAGES AND CURRENTS FOR READ AND WRITE OPERATIONS

CROSS-REFERENCE TO RELATED APPLICATIONS

This application is a Continuation-in-Part application of U.S. patent application Ser. No. 14/848,279, filed Sep. 8, 2015 and claiming the benefit of U.S. Provisional Application No. 62/140,059, filed Mar. 30, 2015, the entire contents of both of which are incorporated herein by reference.

FIELD

Embodiments described herein relate generally to a semiconductor storage device.

BACKGROUND

In recent years, an interfacial phase change memory (iPCM) is developed as one of new semiconductor storage devices. In an iPCM, a crystalline state of a variable resistance element is subjected to a phase change by applying a voltage thereto. By this phase change, the variable resistance element is brought into a low-resistance state or a high-resistance state, and stores data therein on the basis of these two states.

In all resistance random access memories, including the iPCM mentioned above, a magnetic random access memory (MRAM), a phase change memory (PCM) which changes in phase between an amorphous phase and a crystalline phase, and a resistance random access memory (ReRAM), realization of a method and circuit for optimizing a voltage and current necessary for a phase change with respect to a surrounding environmental temperature is desired.

BRIEF DESCRIPTION OF THE DRAWINGS

FIG. 6 is a circuit diagram of an Irst generator included in a semiconductor storage device of a third embodiment;

FIG. 7 is a graph showing temperature dependence of a reset current in the semiconductor storage device of the third embodiment;

FIG. 8 is a circuit diagram of a Vset2 generator included in a semiconductor storage device of a fourth embodiment;

FIGS. 15 and 16 are circuit diagrams showing examples of operational amplifiers.

DETAILED DESCRIPTION

Hereinafter, semiconductor storage devices of the embodiments will be described with reference to the drawings. In the following descriptions, constituent elements having an identical function and configuration are denoted by identical reference symbols, and duplicated descriptions are given only when necessary. Further, the following embodiments exemplify devices and methods for realizing the technical ideas of the embodiments, and are not intended to limit the material, shape, structure, arrangement, and the like of the constituent parts to those in the following.

In general, according to one embodiment, a semiconductor storage device includes: a memory cell including a variable resistance element; a bit line coupled to the memory cell; and a first circuit applying a first voltage to the bit line in a write operation for the memory cell. When a temperature of the variable resistance element is lower than or equal to a first temperature, a temperature coefficient of the first voltage is 0. When the temperature of the variable resistance element is higher than the first temperature, the temperature coefficient of the first voltage is negative.

In the following embodiments, descriptions will be given by taking an interfacial phase change memory (iPCM) as an example of a semiconductor storage device.

1. First Embodiment

A semiconductor storage device of a first embodiment will be described below.

1.1 Overall Configuration of Semiconductor Storage Device

Figure 1:
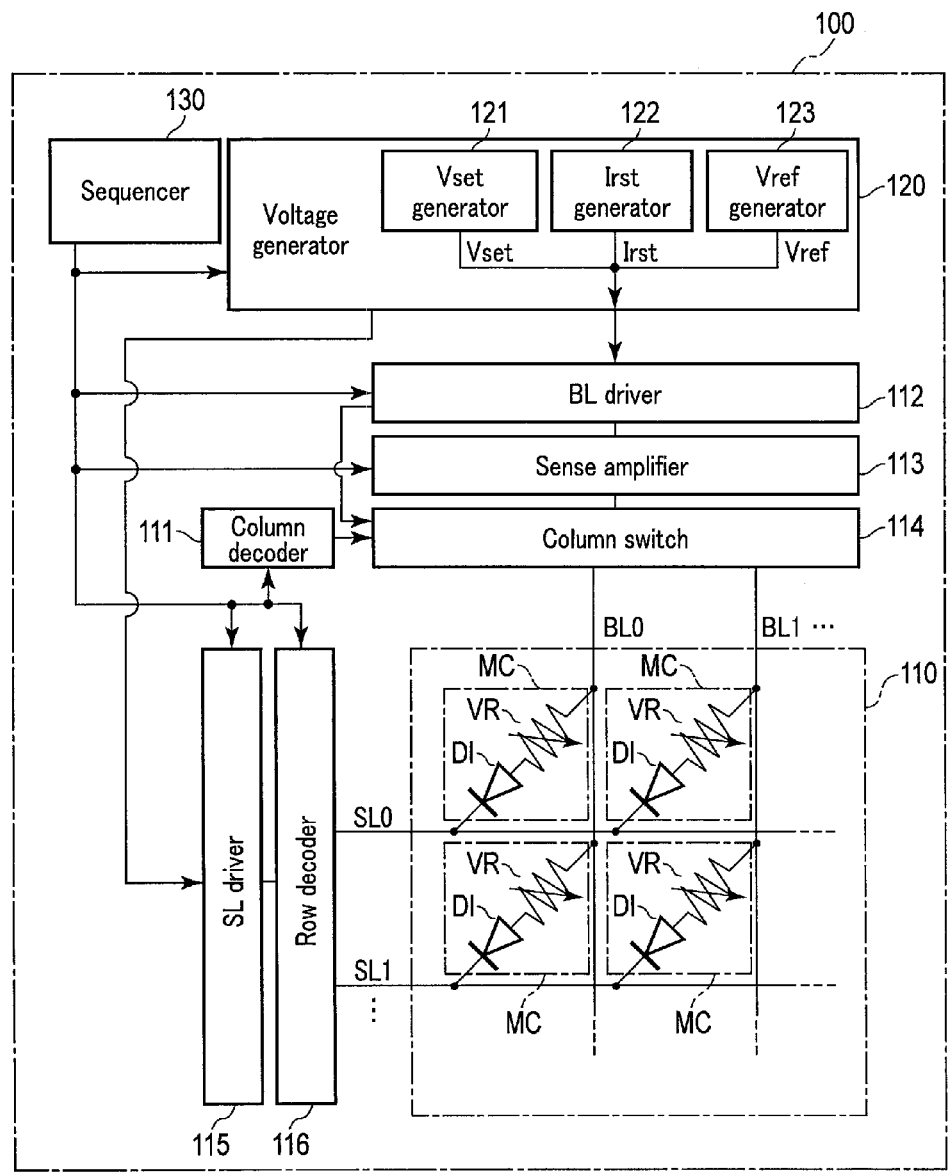
FIG. 1 is a block diagram showing the overall configuration of a semiconductor storage device of a first embodiment.

FIG. 1 is a block diagram showing the overall configuration of the semiconductor storage device of the first embodiment. The semiconductor storage device 100 of this embodiment includes a memory cell array 110, column decoder 111, bit-line driver 112, sense amplifier 113, column switch 114, source-line driver 115, row decoder 116, voltage generator 120, and sequencer 130.

The memory cell array 110 includes a plurality of memory cells MC arranged on a semiconductor substrate in a matrix form. It should be noted that the number of the memory cells MC is arbitrary. Memory cells arranged on the same column are connected to a certain bit line BL (BL0, BL1, . . . ) as a common connection. Further, memory cells arranged on the same row are connected to a certain source line SL (SL0, SL1, . . . ) as a common connection. A memory cell MC includes a variable resistance element VR, and a diode DI connected in series. The variable resistance element VR is connected to a bit line BL at one end thereof, and is connected to an anode of the diode DI at the other end thereof. In the diode DI, a cathode thereof is connected to a source line SL. The variable resistance element VR in this embodiment constitutes a super lattice including, for example, germanium Ge, tellurium Te, and antimony Sb, and a germanium-tellurium layer, and an antimony-tellurium layer are laminated therein. The super lattice is brought into a low-resistance state or a high-resistance state according to a change in crystalline state. More specifically, when, for example, a necessary voltage pulse is applied to the super lattice, germanium atoms Ge in the super lattice move to change the bonding state of the germanium atoms Ge and tellurium atoms Te. An element having such characteristics is defined as a super lattice phase-change element. In the following description, a change in crystalline state of the variable resistance element is called a "phase change", a state where the variable resistance element VR is in a low-resistance state is called a "set state", and a state where the variable resistance element VR is in a high-resistance state is called a "reset state". It should be noted that the diode DI shown in FIG. 1 may be replaced with a diode-connected transistor.

The column decoder 111 decodes a column address to obtain a column address decoded signal.

The column switch 114 selects one of the bit lines BL on the basis of the column address decoded signal, and connects the selected bit line BL to the sense amplifier 113.

The bit-line driver 112 applies voltages necessary for read operation, for example, to the sense amplifier 113. For example, the bit-line driver 112 applies voltages necessary for write operation to the memory cell MC though the column switch 114.

In the read operation, the sense amplifier 113 senses the data read from a memory cell MC onto a bit line BL. Also, in the write operation, the sense amplifier 113 may sense a voltage of a bit line BL while the bit-line driver 112 applies a voltage to the memory cell MC.

The source-line driver 115 applies voltages necessary for read, write, and erasure operation to the row decoder 116.

The row decoder 116 selects one of the source lines SL on the basis of a row address decoded signal obtained by decoding a row address. Further, the row decoder 116 applies an appropriate voltage to each of a selected source line SL and unselected source lines SL.

The voltage generator 120 generates voltages and currents necessary for read, write, and erasure operation by raising or lowering a power-supply voltage VDD to be applied from outside, and supplies the generated voltages and currents to, for example, the bit-line driver 112, source-line driver 115 or the like. More specifically, the voltage generator 120 includes a Vset generator 121, Irst generator 122, and Vref generator 123. The Vset generator 121 generates a set voltage Vset needed to make the variable resistance element VR carry out a phase change, and bring the variable resistance element VR into the set state, and applies the set voltage Vset to the bit-line driver 112. The Irst generator 122 generates a reset current Irst needed to make the variable resistance element VR carry out a phase change, and bring the variable resistance element VR into the reset state, and supplies the reset current Irst to the bit-line driver 112. The Vref generator 123 generates a reference voltage Vref needed, for example, at the time of the read operation, and applies the reference voltage Vref to the bit-line driver 112.

The sequencer 130 controls operations of the whole semiconductor storage device 100. More specifically, the sequencer 130 controls, for example, the voltage generator 120, the bit-line driver 112, the sense amplifier 113, the column switch 114, the source-line driver 115, and the row decoder 116.

1.2 Configuration of Vset Generator

Figure 2:
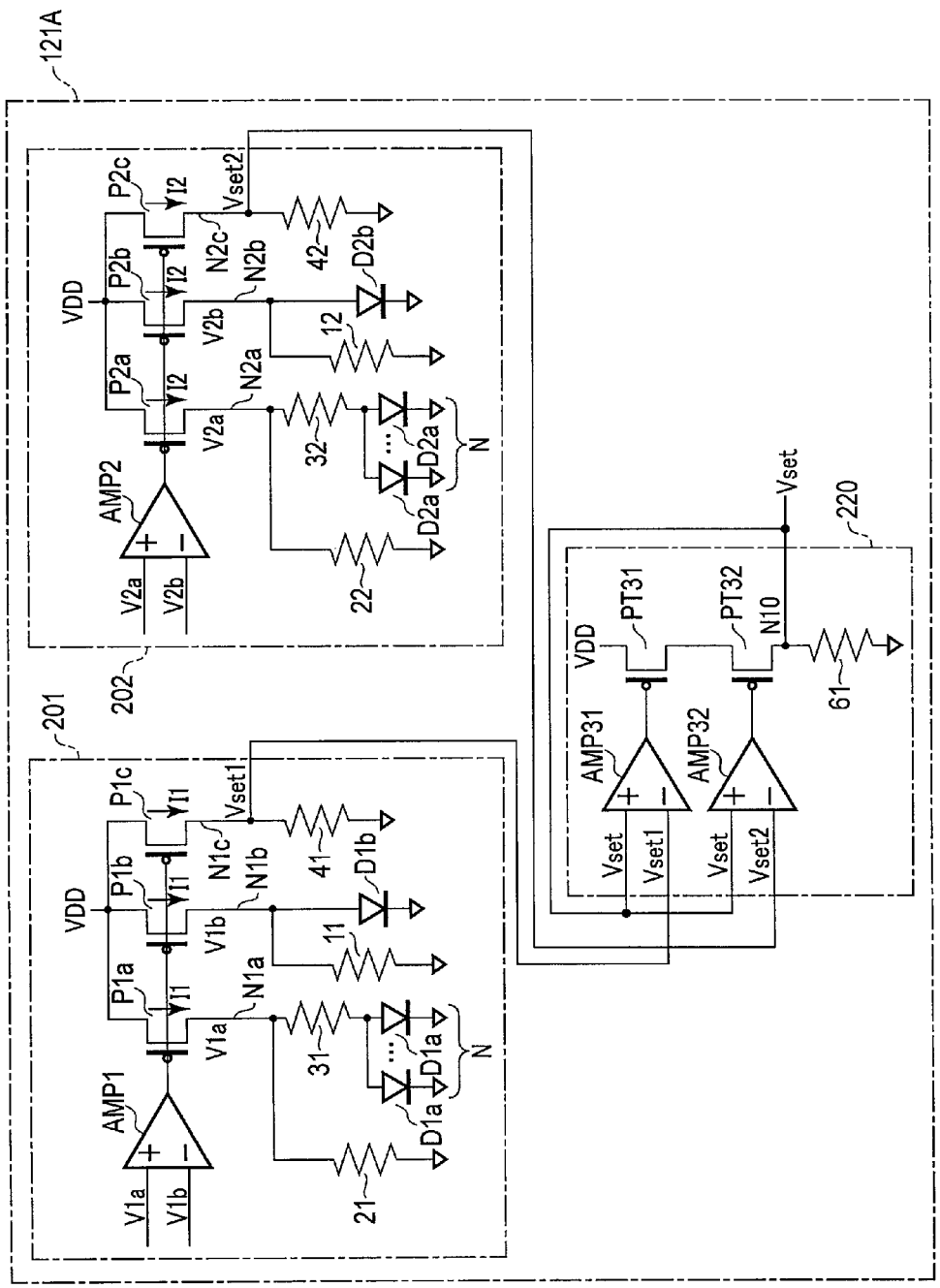
FIG. 2 is a circuit diagram of a Vset generator included in the semiconductor storage device of the first embodiment.

A Vset generator 121A shown in FIG. 2 is a circuit diagram of the Vset generator 121 in this embodiment. The Vset generator 121A of this embodiment includes bandgap reference (BGR) circuits 201 and 202, and a voltage selection circuit 220.

The configuration of each of the BGR circuits is described in, for example, H. Banba, H. Shiga, A. Umezawa, T. Miyaba, T. Tanzawa, S. Atsumi, and K. Sakui, "A CMOS Bandgap Reference Circuit with Sub-1-V Operation" IEEE JOURNAL OF SOLID-STATE CIRCUITS VOL., 34, NO. 5, May 1999. The whole of this literature is incorporated herein as a reference.

First, the configuration of each of the BGR circuits 201 and 202 will be described below.

The BGR circuit 201 includes an operational amplifier AMP1, p-channel MOS transistors P1a, P1b, and P1c, resistance elements 11, 21, 31, and 41, N (N is an integer greater than or equal to 2) diodes D1a, and diode D1b.

The diodes D1a and the diode D1b have the same current-voltage characteristics. In the operational amplifier AMP1, a voltage V1a of a node N1a is input to a non-inverting input terminal, a voltage V1b of a node N1b is input to an inverting input terminal, and an output terminal is connected to gates of the transistors P1a, P1b, and P1c as a common connection.

The transistors P1a, P1b, and P1c have the same transistor size (for example, a gate width and/or a gate length, and the like). In the transistors P1a, P1b, and P1c, their sources are connected to a power supply node applying a power-supply voltage VDD as a common connection, and their drains are connected to the node N1a, node N1b, and a node N1c, respectively.

The N diodes D1a are connected in parallel with each other, and their cathodes are grounded.

The resistance element 21 is connected to the node N1a at one end thereof, and is connected to the ground node (is grounded) at the other end thereof. The resistance element 31 is connected to the node N1a at one end thereof, and is connected to anodes of the diodes D1a as a common connection. The resistance element 11 is equal to the resistance element 21 in resistance value, is connected to the node N1b at one end thereof, and is grounded at the other end thereof.

An anode of the diode D1b is connected to the node N1b, and a cathode thereof is grounded.

The resistance element 41 is connected to the node N1c at one end thereof, and is grounded at the other end thereof.

The operational amplifier AMP1 compares the voltages V1a and V1b with each other to thereby output a voltage based on the comparison result. That is, the operational amplifier AMP1 controls voltages to be applied to the gates of the transistors P1a, P1b, and P1c in such a manner that the voltages V1a and V1b become equal to each other.

More specifically, a non-inverting input terminal of the operational amplifier AMP1 is applied with voltage V1a, and an inverting input terminal thereof is applied with voltage V1b. When voltage V1a is higher than voltage V1b, the operational amplifier AMP1 outputs a voltage which is higher than voltage V1a. When the voltage V1a is lower than the voltage V1b, the operational amplifier AMP1 outputs a voltage which is lower than voltage V1a.

In the configuration described above, the BGR circuit 201 outputs the voltage of the node N1c as an output voltage Vset1.

In the BGR circuit 201, currents I1 flowing through the node N1a, node N1b, and node N1c are equal to each other, and are expressed by the following formula (1).

$$I1=(V1b+(R11/R31)\cdot VT\cdot \ln N)/R11 \quad (1)$$

Here, R11 is a resistance value of the resistance element 11, and R31 is a resistance value of the resistance element 31. Further, VT is the thermoelectromotive force of the diode, and is expressed by the following formula (2).

$$VT=kT/q \quad (2)$$

Here, k is the Boltzmann constant, T is an absolute temperature, and q is a charge amount of electrons.

From the formula (1), the voltage Vset1 is expressed by the following formula (3).

$$Vset1=(V1b+(R11/R31)\cdot VT\cdot \ln N)\cdot R41/R11 \quad (3)$$

Here, R41 is a resistance value of the resistance element 41. Accordingly, by appropriately selecting a ratio between R11 and R41, it is possible to change the voltage of Vset1.

In the formula (3), V1b is a built-in potential of the diode, and has a negative temperature dependence, and hence by appropriately selecting the ratio R11/R31, it is possible to change the temperature characteristics of the voltage Vset1. A voltage (current) having a negative temperature dependence indicates a state where the temperature coefficient of the voltage (current) is negative and the voltage (current) decreases in accordance with a temperature increase. More specifically, the temperature characteristics of the built-in potential of the diode is −2 [mV/° C.], and hence in order to make the voltage Vset1 has no temperature dependence, it is sufficient if the ratio R11/R31 is made to satisfy the following formula (4).

$$(R11/R31)\cdot(k/q)\cdot \ln N=2 \text{ [mV]} \quad (4)$$

As a result, the BGR circuit 201 applies a constant voltage irrespective of the temperature (having no temperature dependence, in which case the temperature coefficient of the voltage is 0).

The BGR circuit 202 has the same configuration as the BGR circuit 201, and includes an operational amplifier AMP2, p-channel MOS transistors P2a, P2b, and P2c, resistance elements 12, 22, 32, and 42, N (N is an integer greater than or equal to 2) diodes D2a, diode D2b, and nodes N2a, N2b, and N2c. A voltage of node N2a is V2a. A voltage of node N2b is V2b. Currents flowing through node N2a, node N2b, and node N2c are I2. The transistors P2a, P2b, and P2c have the same transistor size. The diodes D2a, and the diode D2b have the same current-voltage characteristics. Further, the BGR circuit 202 outputs the voltage of the node N2c as an output voltage Vset2.

Further, in the BGR circuit 202 too, the above-mentioned formulae (1) to (3) are established as in the case of the BGR circuit 201. However, in the BGR circuit 202, the configuration is contrived in such a manner that the formula (5) is established in place of the formula (4).

$$(R12/R32)\cdot(k/q)\cdot \ln N<2 \text{[mV]} \quad (5)$$

Here, R12 is a resistance value of the resistance element 12, and R32 is a resistance value of the resistance element 32. As a result, the output voltage of the BGR circuit 202 has a negative temperature dependence.

Next, the voltage selection circuit 220 will be described below. The voltage selection circuit 220 is a circuit comparing the voltage Vset1 and voltage Vset2 with each other, and output the lower voltage as a set voltage Vset. The voltage selection circuit 220 includes two operational amplifiers AMP31 and AMP32, p-channel MOS transistors PT31 and PT32, and resistance element 61.

The gate of transistor PT31 is applied with an output voltage of operational amplifier AMP31, the source thereof is applied with voltage VDD, and the drain thereof is connected to the source of transistor PT32.

The gate of transistor PT32 is applied with an output voltage of operational amplifier AMP32, and the drain thereof is connected to node N10.

One end of resistance element 61 is connected to node N10, and the other end thereof is grounded.

The voltage at node N10 is output from Vset generator 121A as set voltage Vset.

Operational amplifier AMP31 compares voltage Vset1 and set voltage Vset with each other, and applies a voltage based on the result of this comparison to the gate of transistor PT31. Accordingly, operational amplifier AMP31 brings transistor PT31 into the ON state where voltage Vset1 is higher than set voltage Vset (Vset1>Vset).

Operational amplifier AMP32 compares voltage Vset2 and set voltage Vset with each other, and applies a voltage based on the result of this comparison to the gate of transistor PT32. Accordingly, operational amplifier AMP32 brings transistor PT32 into the ON state where voltage Vset2 is higher than set voltage Vset (Vset2>Vset).

Transistor PT31 and transistor PT32 are connected in series. For the application of set voltage Vset, therefore, both transistor PT31 and transistor PT32 have to be in the ON state. That is, set voltage Vset is applied where it is lower than both voltages Vset1 and voltage Vset2. The voltage selection circuit 220 outputs a lower voltage of voltage Vset1 and voltage Vset2 as set voltage Vset.

Figure 3:
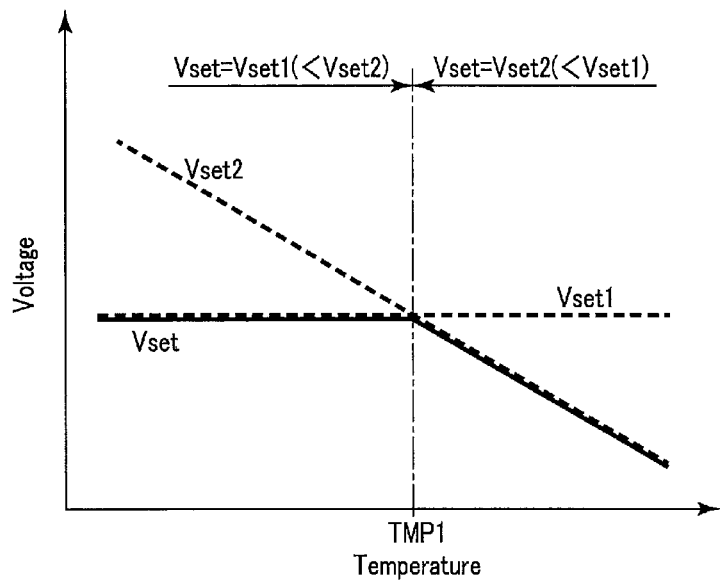
FIG. 3 is a graph showing temperature dependence of a set voltage in the semiconductor storage device of the first embodiment.

Accordingly, the temperature dependence of the output voltage Vset of the Vset generator 121A becomes as shown in FIG. 3. FIG. 3 is a graph showing the temperature dependence of the set voltage Vset. In FIG. 3, the graphs shown by broken lines are graphs of the voltages Vset1 and Vset2, and the graph shown by a solid line is a graph of the voltage Vset. In FIG. 3, in order to make the part at which the broken line and the solid line overlap each other easy to understand, the broken line and the solid line are drawn in parallel with each other. As shown in FIG. 3, in a range lower than or equal to a given temperature TMP1 ("Vset=Vset1(<Vset2)" in FIG. 3), voltage Vset1 is lower than voltage Vset2 and is output as set voltage Vset. Hence, voltage Vset has no temperature dependence. Conversely, in a range higher than the temperature TMP1 ("Vset=Vset2 (<Vset1)" in FIG. 3), voltage Vset2 is lower than voltage Vset1 and is output as set voltage Vset. Hence, voltage Vset has a negative temperature dependence.

1.3 Write Operation

Next, a write operation in this embodiment will be described below. In this embodiment, bringing the variable resistance element VR from the reset state into the set state is defined as "0" data write, and bringing the variable resistance element VR from the set state into the reset state is defined as "1" data write. It should be noted that the definition of the "0" data and "1" data may be reversed.

First, the "0" data write will be described. The source-line driver 115 applies a voltage VSS (for example, 0 V) to a selected source line SL corresponding to the selected memory cell MC. In this state, the bit-line driver 112 applies a set voltage pulse to a selected bit line BL. The set voltage pulse is a voltage pulse realized by applying the set voltage Vset to the variable resistance element VR for a certain period (time Tset). At this time, a forward bias is applied to the diode DI of the selected memory cell MC, and a set current Iset flows from the selected bit line BL to the selected source line SL through the variable resistance element VR. Further, the variable resistance element VR applied with the set voltage Vset and carries out a phase change to be brought into the set state.

Next, the "1" data write will be described. As in the case of the "0" data write, the source-line driver 115 applies the voltage VSS (for example, 0 V) to the selected source line SL corresponding to the selected memory cell MC. In this state, the bit-line driver 112 applies a reset voltage pulse to the selected bit line BL. The reset voltage pulse is a voltage pulse realized by applying the reset voltage Vrst to the variable resistance element VR for a certain period (time Trst). At this time, a reset current Irst flows from the selected bit line BL to the selected source line SL through the variable resistance element VR. Further, the variable resistance element VR carries out a phase change to be brought into the reset state.

Then, the bit-line driver 112 applies the voltage VSS to the unselected bit lines BL. The source-line driver 115 applies a voltage higher than the voltage to be applied to the selected bit line BL to the unselected source lines SL. Thereby, a reverse bias is applied to the diodes DI of the unselected memory cells MC, and hence no currents flow through the unselected memory cells MC. Accordingly, in each of the variable resistance elements VR of the unselected memory cells MC, no phase change occurs, and no data is written.

It should be noted that it is sufficient if each of the set voltage pulse and the reset voltage pulse has a voltage and duration necessary for a phase change, and a relationship between the set voltage Vset and reset voltage Vrst, and a relationship between the time Tset and time Trst are not particularly limited.

Next, a relationship between the voltage (a potential difference between both ends of the variable resistance element VR) to be applied to the variable resistance element VR and phase change caused by the voltage application will be described below.

Figure 4:
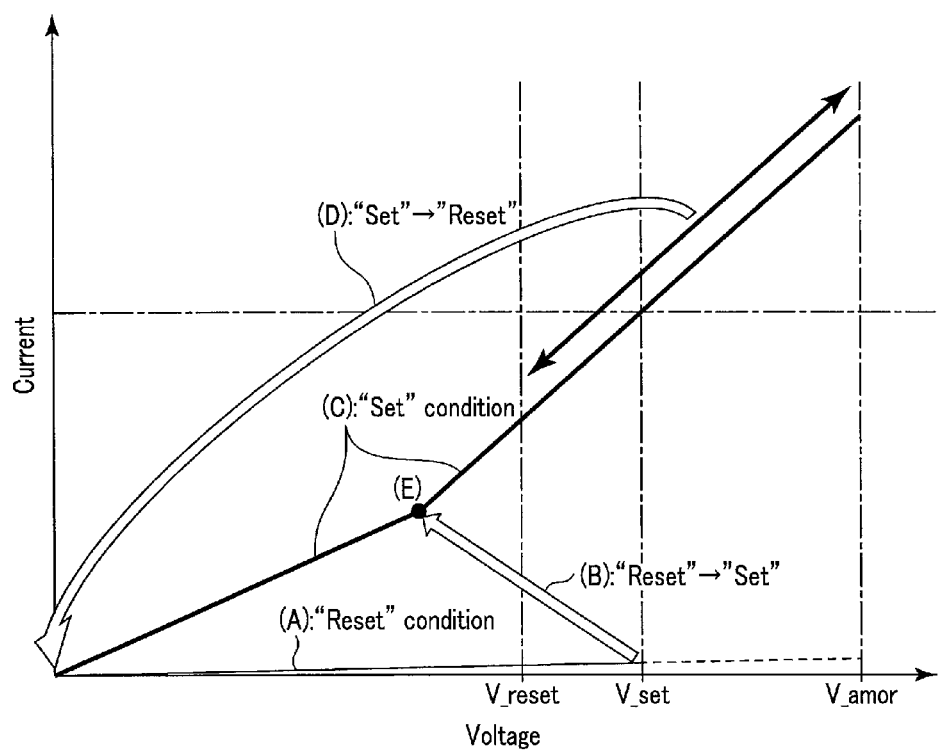
FIG. 4 is a graph showing a relationship between a voltage to be applied to a variable resistance element included in the semiconductor storage device of the first embodiment and a current (namely, a phase change state)

FIG. 4 is a graph showing the relationship between the voltage to be applied to the variable resistance element VR and a current (namely, a phase change state). First, the case where the set voltage pulse is applied to the variable resistance element VR will be described below. When the variable resistance element VR is in the reset state (high-resistance state) (line (A): "Reset" condition in FIG. 4), even if the applied voltage is increased, the current flowing through the variable resistance element VR is hardly increased. After the applied voltage reaches the voltage V_set, concomitantly with a decrease of the variable resistance element VR in resistivity, the current increases (line (B): "Reset"->"Set" in FIG. 4), and the variable resistance element VR is brought into the set state (point (E)). The variable resistance element VR increases its voltage after it is brought into the set state and returns to the reset state when its voltage exceeds the reset voltage. To stably keep the variable resistance element VR in the set state, the voltage and current have to be gradually returned to "0" (quench) after the variable resistance element VR is brought into the set state.

Next, the case where a reset voltage pulse is applied to the variable resistance element VR will be described below. When the variable resistance element VR is in the set state (low-resistance state) (line (C): "Set" condition in FIG. 4), a current flows through the variable resistance element VR in a larger amount than that of the reset state. When the voltage has become greater than or equal to the minimum voltage V_reset (which is necessary for causing a phase change to the reset state) but is still lower than voltage V_amor (at which the variable resistance element changes into an amorphous state), the voltage is lowered (rapid cooling), so that the variable resistance element VR carries out a phase change and is kept in the reset state (line (D): "Set"->"Reset" in FIG. 4).

1.4 Advantage of First Embodiment

When the configuration according to this embodiment is employed, it is possible to improve the reliability of the write operation. This advantage will be described below.

Although the iPCM has been proposed as a device by which low current consumption and low-voltage operation can be expected, and as a variable resistance type memory, a method and circuit for optimizing the set voltage Vset with respect to a surrounding environmental temperature have not been proposed.

Regarding this, the inventors of the present application have found that the optimum set voltage of the iPCM differs depending on the surrounding environmental temperature. That is, the inventors have found that the set voltage has no temperature dependence (the set voltage is constant irrespective of the temperature of the variable resistance element VR) at temperatures lower than or equal to a certain temperature, and has a negative temperature dependence (the set voltage decreases in accordance with a temperature of the variable resistance element VR increases) at temperatures higher than such a temperature. In other words, when the temperature of the variable resistance element VR is lower than or equal to a certain temperature, the temperature coefficient of the set voltage Vset is 0. When the temperature of the variable resistance element VR is higher than such a temperature, the temperature coefficient of the set voltage Vset is negative.

For example, when a given set voltage Vset is applied to the variable resistance element VR without taking the temperature dependence into consideration, there is the possibility of the variable resistance element VR not carrying out a phase change to the set state in a certain temperature range. That is, there is the possibility of erroneous write of "0" data being caused.

Thereupon, in this embodiment, the optimum temperature characteristics of the set voltage found in the iPCM are imparted to the output voltage of the Vset generator 121. More specifically, the Vset generator 121 includes the BGR circuit 201 having no temperature dependence and BGR circuit 202 having a negative temperature dependence. Further, by selecting a lower voltage from voltages output from these BGR circuits, and applying the selected lower voltage to the memory cell MC, it is possible for the Vset generator 121 to apply the optimum set voltage Vset corresponding to the temperature to the variable resistance element VR. Accordingly, the variable resistance element VR can carry out a phase change to the set state irrespective of the surrounding environmental temperature. As a result, it is possible to prevent erroneous write from being caused, and improve the reliability of the write operation.

Furthermore, this embodiment achieves the advantages as described above whether the number of the diodes D1a included in the BGR circuit 201 and the number of the diodes D2a included in the BGR circuit 202 are the same or not. For example, the number of diodes D1a and the number of diodes D2a may be 50 or 100. That is, this embodiment achieves the advantages as described above, when the BGR circuit 201 and the BGR circuit 202 satisfy the formula (4) and the formula (5), respectively.

2. Second Embodiment

A semiconductor storage device of the second embodiment will be described. The second embodiment differs from the first embodiment in terms of the circuit configurations of the voltage selection circuit. In the following, only points different from the first embodiment will be described

2.1 Overall Configuration of Semiconductor Storage Device

The overall configuration of the semiconductor storage device 100 of the second embodiment is similar to the configuration shown in FIG. 1 in connection with the first embodiment.

2.2. Configuration of Vset Generator

Figure 5:
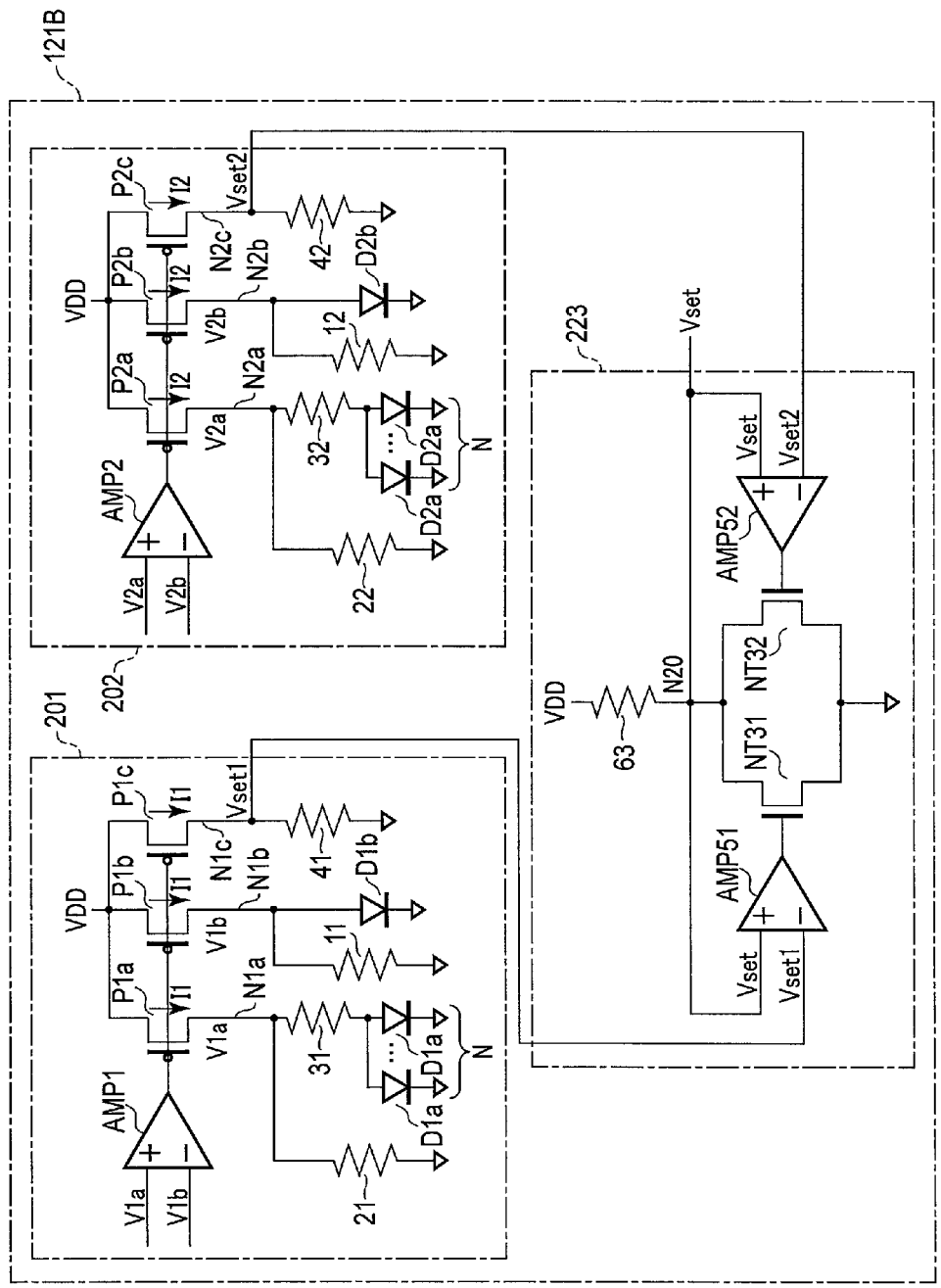
FIG. 5 is a circuit diagram of a Vset generator included in the semiconductor storage device of a second embodiment.

A Vset generator 121B shown in FIG. 5 is a circuit diagram of the Vset generator 121 in this embodiment. The Vset generator 121B of the second embodiment includes BGR circuits 201 and 202 and a voltage selection circuit 223. The BGR circuits 201 and 202 are similar to those shown in FIG. 2 in connection with the first embodiment.

The voltage selection circuit 223 compares voltage Vset1 and voltage Vset2 with each other and outputs the lower voltage as set voltage Vset. The voltage selection circuit 223 includes two operational amplifiers AMP51 and AMP52, n-channel MOS transistors NT31 and NT32 and resistance element 63.

The gate of transistor NT31 is applied with an output voltage of operational amplifier AMP51, the drain thereof is connected to node N20, and the source thereof is grounded.

The gate of transistor NT32 is applied with an output voltage of operational amplifier AMP52, the drain thereof is connected to node N20, and the source thereof is grounded.

One end of resistance element 63 is connected to node N20, and the other end is applied with power-supply voltage VDD.

The voltage at node N20 is output from Vset generator 121B as set voltage Vset.

Operational amplifier AMP51 compares voltage Vset1 and set voltage Vset with each other and applies a voltage based on the result of this comparison to the gate of transistor NT31. The operational amplifier AMP51 brings transistor NT31 into the ON state to lower set voltage Vset, where voltage Vset1 is lower than set voltage Vset (Vset1<Vset).

Operational amplifier AMP52 compares voltage Vset2 and set voltage Vset with each other and applies a voltage based on the result of this comparison to the gate of transistor NT32. The operational amplifier AMP52 brings transistor NT32 into the ON state to lower set voltage Vset, where voltage Vset2 is lower than set voltage Vset (Vset2<Vset).

Transistor NT31 and transistor NT32 are connected in parallel. To lower set voltage Vset (discharge), either of transistor PT31 and transistor PT32 may be in the ON state. Therefore, where set voltage Vset is lower than both voltage Vset1 and voltage Vset2, the voltage selection circuit 223 turns off transistors NT31 and NT32 to keep set voltage Vset from lowering (discharge).

As a result, the temperature dependence of the output voltage Vset of the Vset generator 121B is similar to that shown in FIG. 3 in connection with the first embodiment. That is, the set voltage Vset has a negative temperature dependence.

2.3 Write Operation

The write operation performed by the second embodiment is similar to that performed by the first embodiment.

2.4. Advantage of Second Embodiment

With the configuration mentioned above, the second embodiment provides advantages similar to those of the first embodiment.

3. Third Embodiment

A semiconductor storage device of a third embodiment will be described below. The third embodiment is an embodiment in which a BGR circuit having a negative temperature dependence is applied to the Irst generator 122 described in the first embodiment. In the following, only points different from the first embodiment will be described.

3.1 Configuration of Irst Generator

FIG. 6 is a circuit diagram of an Irst generator 122. The Irst generator 122 of this embodiment includes a BGR circuit 203. What makes the BGR circuit 203 different from the BGR circuits 201 and 202 is that the resistance element 41 (or the resistance element 42) is annulled, and current output is employed instead. Relation between the overall configuration shown in FIG. 1 and the Irst generator 122 shown in FIG. 6 was described in the first embodiment; thus, reference to a detailed relation will be omitted.

The BGR circuit 203 includes an operational amplifier AMP3, p-channel MOS transistors P3a, P3b, and P3c, resistance elements 13, 23, and 33, N (N is an integer greater than or equal to 2) diodes D3a, diode D3b, and nodes N3a, N3b, and N3c. A voltage of node N3a is Via. A voltage of node N3b is V3b. Currents flowing through node N3a, node N3b, and node N3c are I3.

The transistors P3a, P3b, and P3c have the same transistor size.

The diodes D3a, and the diode D3b have the same current-voltage characteristics. Further, connection of each element is identical to the BGR circuits 201 and 202. Further, the Irst generator 122 outputs a current I3 flowing through a node N3c as the reset current Irst ("Irst(=I3)" in FIG. 6).

Next, a relationship between the reset current Irst and surrounding environmental temperature will be described below.

FIG. 7 is a graph showing temperature dependence of the reset current Irst. The reset current Irst in the iPCM has a negative temperature dependence. Accordingly, when the resistance values of the resistance elements 13 and 33 are assumed to be R13 and R33, a relationship of the following formula (5') is established.

$$(R13/R33) \cdot (k/q) \cdot \ln N < 2[mV] \tag{5'}$$

Accordingly, in the BGR circuit 203, the ratio R13/R33 is set in such a manner that the reset current Irst has a negative temperature dependence.

3.2 Advantage of Third Embodiment

When the configuration according to this embodiment is employed, it is possible to improve the reliability of the write operation. This advantage will be described below.

The inventors of the present application have found that when a reset current pulse is to be applied to the variable resistance element VR, the reset current flowing through the variable resistance element VR has the optimum value depending on the surrounding environmental temperature. That is, the inventors have found that the reset current has a negative temperature dependence.

Accordingly, when the reset voltage pulse is to be applied to the variable resistance element VR, it is necessary to control the reset current Irst flowing through the variable resistance element VR according to the temperature.

For example, when a given reset current Irst is supplied to the variable resistance element VR without taking the temperature dependence into consideration, there is the possibility of the variable resistance element VR not carrying out a phase change to the reset state in a certain temperature range. That is, there is the possibility of erroneous write of "1" data being caused.

Thereupon, in this embodiment, the optimum temperature dependence of the reset current found in the iPCM is imparted to the output current of the Irst generator 122. More specifically, the Irst generator 122 includes the BGR circuit 203 having a negative temperature dependence. Further, by using the BGR circuit 203 as a current source circuit, it is possible for the Irst generator 122 to supply the optimum reset current Irst corresponding to the temperature to the variable resistance element VR. Accordingly, the variable resistance element VR can carry out a phase change to the reset state irrespective of the surrounding environmental temperature. As a result, it is possible to prevent erroneous write from being caused, and improve the reliability of the write operation.

4. Fourth Embodiment

A semiconductor storage device of a fourth embodiment will be described below. The overall configuration of the semiconductor storage device 100 of the fourth embodiment is similar to that shown in FIG. 1 in connection with the first embodiment. What makes the fourth embodiment different from the first to third embodiments is that the Vset generator 121 does not include BGR circuit 202 and a voltage Vset2 having a negative temperature dependence is generated by using a resultant current obtained by combining an output current from a BGR circuit having no temperature dependence and an output current from a BGR circuit having a negative temperature dependence with each other. Hereinafter, only points different from the first embodiment will be described.

4.1 Configuration of Vset2 Generator

FIG. 8 is a circuit diagram of a Vset2 generator 210 in this embodiment. The Vset generator 121 of the embodiment employs a Vset2 generator 210 in place of the BGR circuit 202 (FIG. 2) of the first embodiment. The Vset generator 121 of the embodiment includes a BGR circuit 201 and a voltage selection circuit 220, as in the first embodiment. The Vset2 generator 210 of this embodiment includes BGR circuits 204 and 205, and resistance element 62.

The BGR circuit 204 is a circuit obtained by annulling the resistance element 42 in the BGR circuit 202 described in connection with FIG. 2, and a current I2 is output therefrom. The current I2 has a negative temperature dependence. That is, a temperature coefficient of the current I2 is negative.

The BGR circuit 205 has a configuration identical to the BGR circuit 204, and includes an operational amplifier AMP4, p-channel MOS transistors P4a, P4b, and P4c, resistance elements 14, 24, and 34, N (N is an integer greater than or equal to 2) diodes D4a, and diode D4b. A voltage of a node connecting transistor P4a and resistance element 34 (or 24) is V4a. A voltage of a node connecting transistor P4b and resistance element 14 (or diode D4b) is V4b. Currents flowing through transistors P4a, P4b, and P4c are I4.

The resistance element 62 is supplied with a sum of current I2 and current I4, namely a current "I2+I4" at one end thereof, and is grounded at the other end thereof. A voltage of the one end of the resistance element 62 is output as voltage Vset2.

The transistors P4a, P4b, and P4c have the same transistor size.

The diodes D4a, and the diode D4b have the same current-voltage characteristics.

Assuming the resistance values of the resistance elements 14 and 34 to be R14 and R34, a relationship of the following formula (4') is established.

$$(R14/R34)\cdot(k/q)\cdot \ln N = 2 [\text{mV}] \quad (4')$$

Accordingly, in the BGR circuit 205, the ratio of R14/R34 is set in such a manner that the current I4 has no temperature dependence. That is, a temperature coefficient of the current I4 is 0.

Further, the voltage Vset2 is generated by using a current obtained by adding the current I4 to the current I2.

4.2 Advantage of Fourth Embodiment

When the configuration according to this embodiment is employed, advantages identical to the first and second embodiments described previously are obtained.

Further, in this embodiment, by adding an output current of the BGR circuit having the negative temperature dependence to an output current of the BGR circuit having no temperature dependence, it is possible to more easily generate a current having required temperature characteristics and a required current value. Hereinafter, specific descriptions will be given.

For example, when the gradient of the temperature characteristics (temperature coefficient) of the output current is optimized, not only the gradient but also the overall current is shifted to be deviated from the optimum values in some cases. More specifically, when the gradient of the positive temperature characteristics (positive temperature dependence) increases, that is, the temperature coefficient increases, the overall current increases. When the absolute value of the gradient of the negative temperature characteristics (negative temperature dependence) increases, that is, the temperature coefficient decreases, the overall current decreases. Therefore, it is difficult to optimize both the gradient and the overall current by one BGR circuit.

Conversely, in this embodiment, first the gradient of the temperature characteristics is optimized by using the current I2 having the negative temperature dependence, and then the current I4 having no temperature dependence is added to the current I2, whereby both the gradient and the overall current value are optimized.

Figure 9:
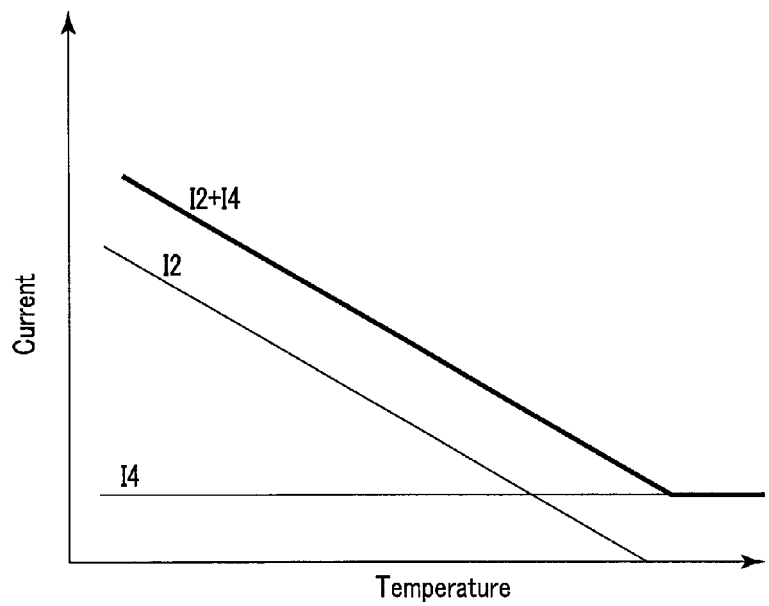
FIG. 9 is a graph showing temperature dependence of a resultant current of a BGR circuit having no temperature dependence, and a BGR circuit having a negative temperature dependence in the semiconductor storage device of the fourth embodiment.

FIG. 9 is a graph showing temperature dependence of a resultant current "I2+I4" of a BGR circuit 205 having no temperature dependence, and a BGR circuit 204 having a negative temperature dependence in the semiconductor storage device of the fourth embodiment. As shown in FIG. 9, it is possible to obtain an output current "I2+I4" having required temperature characteristics and a required current value. By using this output current "I2+I4", it becomes easy to optimize the negative temperature dependence and voltage value of the voltage Vset2. As a result, it is possible to improve the reliability of the write operation.

It should be noted that the configuration according to this embodiment can be applied to the Irst generator 122 of the third embodiment. Thereby, it becomes easy to optimize the reset current Irst. Accordingly, the Irst generator 122 can supply an optimum reset current Irst corresponding to the temperature to the variable resistance element VR. As a result, by virtue of the advantages of the third embodiment and this embodiment, it is possible to improve the reliability of the write operation.

Furthermore, this embodiment achieves the advantages as described above whether the number of the diodes D2a included in the BGR circuit 204 and the number of the diodes D4a included in the BGR circuit 205 are the same or not. That is, this embodiment achieves the advantages as described above, when the BGR circuit 204 and the BGR circuit 205 satisfy the formula (4') and the formula (5), respectively. More specifically, for example, in order to satisfy the formula (4') and the formula (5), the ratio R12/R32 and the ratio R14/R34 may be set when the number of diodes D2a and the number of diodes D4a are the same as N. Further, for example, in order to satisfy the formula (4') and the formula (5), the number of diodes D2a and the number of diodes D4a may be set.

5. Fifth Embodiment

A semiconductor storage device of a fifth embodiment will be described below. The overall configuration of the semiconductor storage device 100 of the fifth embodiment is similar to that shown in FIG. 1 in connection with the first embodiment. The fifth embodiment is an embodiment in which Vset2 generator 210 described in the fourth embodiment is applied to the Vref generator 123 described in the first embodiment. In the following, only points different from the first to fourth embodiments will be described.

5.1 Configuration of Vref Generator

The configuration of the Vref generator 123 of the fifth embodiment is similar to the Vset2 generator 210 shown in FIG. 8 described in the fourth embodiment. A Vref generator 123 includes BGR circuit 204 and 205, and resistance element 62.

When "1" data has been written to the memory cell MC, a voltage of the bit line is assumed to be VBL_H. When "0" data has been written to the memory cell MC, a voltage of the bit line is assumed to be VBL_L. The Vref generator 123 outputs a reference voltage Vref which has a negative temperature dependence and is approximately equal to a mean value of the voltage VBL_H and the voltage VBL_L in the temperature range of an operating guarantee temperature.

5.2 Read Operation

Next, a read operation in this embodiment will be described below. The read operation is carried out by applying a voltage (<Vrst, <Vset) that does not cause the variable resistance element VR to carry out a phase change to a selected bit line BL in a state where a voltage VSS is applied to a selected source line SL, and sensing a change in voltage of the bit line BL attributable to a difference in resistance value between variable resistance elements VR by using the sense amplifier 113.

5.2.1 Voltage of Bit Line in Read Operation

A voltage of a bit line in a read operation will be described below. The sense amplifier 113 compares the reference voltage Vref and the voltage of the bit line BL with each other, and when the voltage of the bit line BL is higher than the reference voltage Vref (VBL_H>Vref), reads the "1" data. On the other hand, when the voltage of the bit line BL is lower than the reference voltage Vref (VBL_L<Vref), the sense amplifier 113 reads the "0" data.

5.2.2 Temperature Dependence of Read Operation

Figure 10:
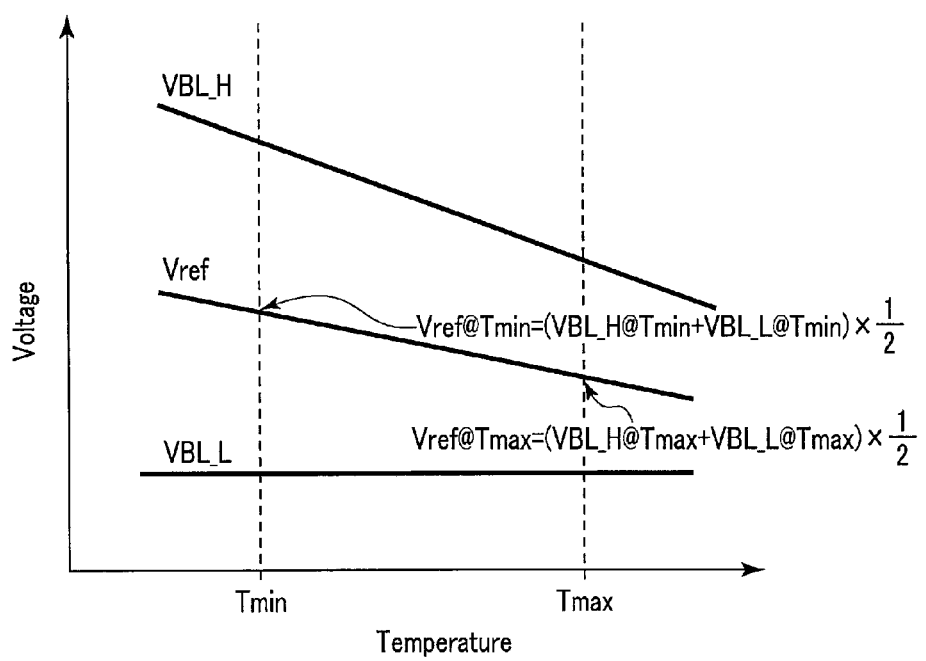
FIG. 10 is a graph showing temperature dependence of a voltage of a bit line BL, and reference voltage Vref in a read operation in a semiconductor storage device in a fifth embodiment.

FIG. 10 is a graph showing temperature dependence of the voltage of the bit line BL, and reference voltage Vref in a read operation in a semiconductor storage device in a fifth embodiment. As shown in FIG. 10, the voltage VBL_H has a negative temperature dependence. Further, the voltage VBL_L hardly has any temperature dependence. Conversely, the reference voltage Vref has a negative temperature dependence in such a manner that the reference voltage Vref is approximately equal to a mean value of the voltage VBL_H and voltage VBL_L. More specifically, the magnitude |dVref/dT| of the gradient of the reference voltage Vref to the temperature is approximately equal to ½ of the magnitude |dVBL_H/dT| of the gradient of the voltage VBL_H to the temperature. That is, the relationship represented by the following formula (6) is established.

$$((dVBL\_H/dT)/2)=(dVref/dT) \quad (6)$$

More specifically, the Vref generator 123 sets the gradient and overall voltage of the reference voltage Vref to satisfy formula (7) and formula (8).

$$Vref@Tmin=((VBL\_H@Tmin+VBL\_L@Tmin)/2) \quad (7)$$

$$Vref@Tmax=((VBL\_H@Tmax+VBL\_L@Tmax)/2) \quad (8)$$

Here, Vref@Tmin, VBL_H@Tmin, and VBL_L@Tmin are reference voltage Vref, voltage VBL_H, and voltage VBL_L at the lower temperature Tmin of the operating guarantee temperature, respectively. Vref@Tmax, VBL_H@Tmax, and VBL_L@Tmax are reference voltage Vref, voltage VBL_H, and voltage VBL_L at the upper temperature Tmax of the operating guarantee temperature, respectively.

5.3 Advantage of Fifth Embodiment

When the configuration according to this embodiment is employed, it is possible to improve the reliability of the read operation. This advantage will be described below.

The inventors of the present application have found that the temperature dependence of the resistance value differs between the case where the variable resistance element VR is in the set state in the read operation and the case where the variable resistance element VR is in the reset state in the read operation. That is, the inventors have found that although the resistance value of the variable resistance element VR in the reset state has a negative temperature dependence, the resistance value of the variable resistance element VR in the set state hardly has any temperature dependence.

For example, when a reference voltage Vref necessary for read is applied without taking the temperature dependence into consideration, there is the possibility of erroneous read of data being caused owing to the fact that a voltage difference between the voltage Vref and voltage VBL_H almost disappears in a certain temperature range or the voltage Vref becomes higher than the voltage VBL_H, and the like.

Thereupon, in this embodiment, the optimum temperature characteristics of the reference voltage Vref found in the iPCM are imparted to the output voltage of the Vref generator 123. More specifically, the Vref generator 123 includes a BGR circuit having a negative temperature dependence. Thereby, it is possible for the Vref generator 123 to apply an optimum reference voltage Vref corresponding to the temperature dependence of the voltage VBL_H and voltage VBL_L to the sense amplifier 113. Accordingly, it is possible to prevent erroneous read from being caused, and improve the reliability of the read operation.

6. Sixth Embodiment

A semiconductor storage device of a sixth embodiment will be described below. The overall configuration of the semiconductor storage device 100 of the sixth embodiment is similar to that shown in FIG. 1 in connection with the first embodiment. What makes the sixth embodiment different from the first to fifth embodiments is that each of the BGR circuits includes a switch circuit, and the switch circuits are controlled according to the magnitudes of an output voltage of an operational amplifier AMP1 and output voltage of an operational amplifier AMP2. Hereinafter, only points different from the first embodiment will be described.

6.1 Configuration of Vset Generator

Figure 11:
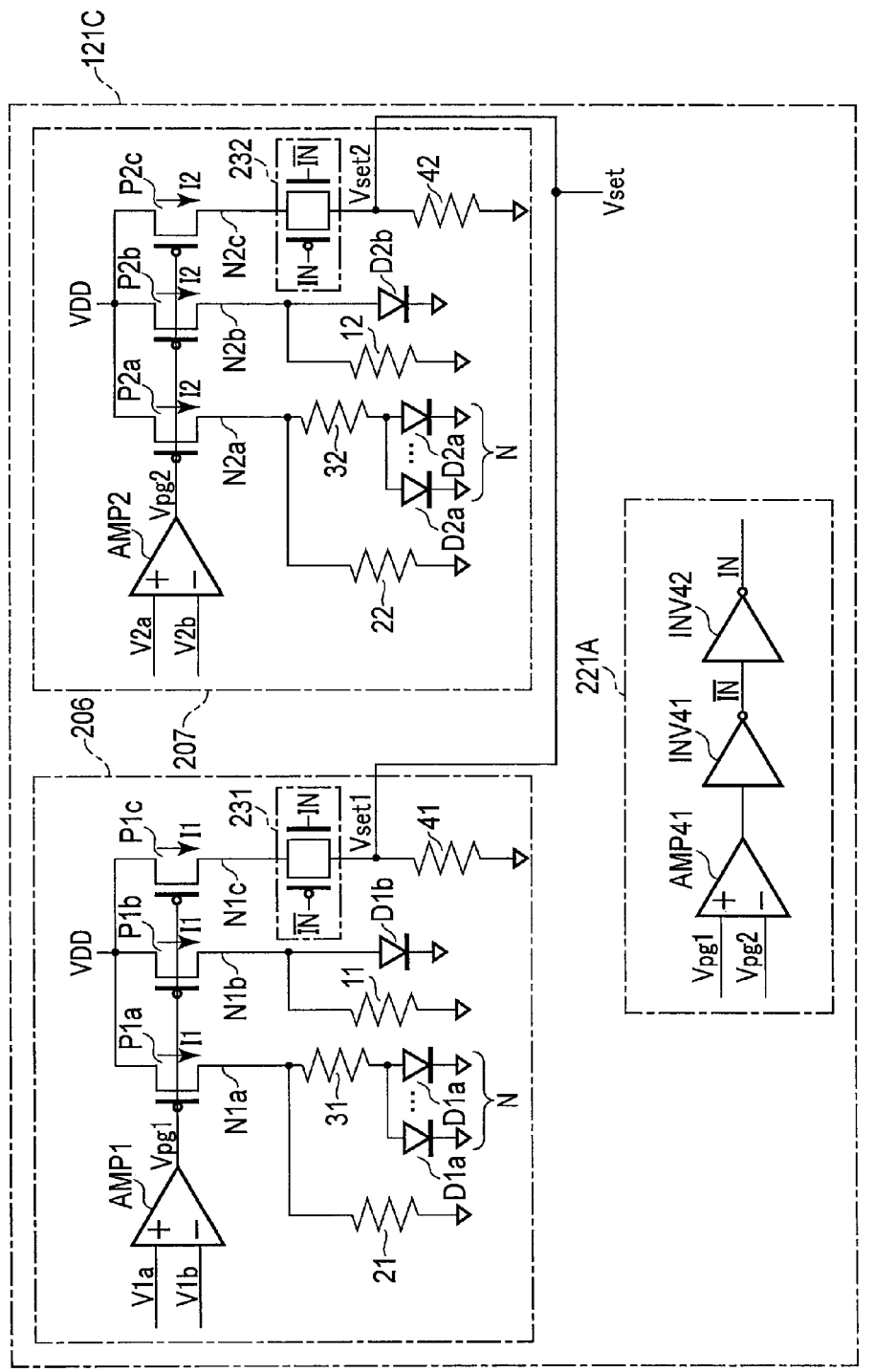
FIG. 11 is a circuit diagram of a Vset generator included in a semiconductor storage device of a sixth embodiment.

A Vset Generator 121C shown in FIG. 11 is a circuit diagram of a Vset generator 121 in this embodiment. The Vset generator 121C of this embodiment includes BGR circuits 206 and 207, and voltage comparison circuit 221A. Relation between the overall configuration shown in FIG. 1 and the Vset generator 121C shown in FIG. 11 was described in the first embodiment; thus, reference to a detailed relation will be omitted.

The BGR circuit 206 is a circuit obtained by providing a switch circuit 231 at the node N1c in the BGR circuit 201 described in connection with FIG. 2. The switch circuit 231 includes an n-channel MOS transistor and p-channel MOS transistor which are connected in parallel with each other, in which a signal IN is input to a gate of the n-channel MOS transistor and a signal /IN is input to a gate of the p-channel MOS transistor.

The BGR circuit 207 is a circuit obtained by providing a switch circuit 232 at the node N2c in the BGR circuit 202 described in connection with FIG. 2. The switch circuit 232 includes an n-channel MOS transistor and p-channel MOS transistor which are connected in parallel with each other, in which a signal /IN is input to a gate of the n-channel MOS transistor and a signal IN is input to a gate of the p-channel MOS transistor. Further, the transistor sizes of the six transistors P1a to P1c, and P2a to P2c are identical.

The voltage comparison circuit 221A includes an operational amplifier AMP41, and inverters INV41 and INV42. In the operational amplifier AMP41, a voltage Vpg1 of an output terminal of the operational amplifier AMP1 of the BGR circuit 206 is input to a non-inverting input terminal, a voltage Vpg2 of an output terminal of the operational amplifier AMP2 of the BGR circuit 207 is input to an inverting input terminal, and the inverters INV41 and INV42 are connected to an output terminal in series. An output of the inverter INV41 becomes the signal /IN, and an output of the inverter INV42 becomes the signal IN.

6.2 Output Operation of Set Voltage Vset

Next, output of the set voltage Vset in this embodiment will be specifically described below. First, when the voltage Vset1 is lower than the voltage Vset2, i.e., when the current I1 is smaller than the current I2, the voltage Vpg1 becomes higher than the voltage Vpg2. Accordingly, the output of the operational amplifier AMP41 is brought to the "H" level, the output of the inverter INV41 is brought to the "L" level, and the output of the inverter INV42 is brought to the "H" level. That is, the signal IN is brought to the "H" level, and the signal /IN is brought to the "L" level, and hence the switch circuit 231 is brought into the on-state and the switch circuit 232 is brought into the off-state. As a result, the voltage Vset1 is output as the set voltage Vset.

On the other hand, when the voltage Vset1 is higher than the voltage Vset2, the voltage Vpg1 becomes lower than the voltage Vpg2, and hence the signal IN is brought to the "L" level, and the signal /IN is brought to the "H" level. Accordingly, the switch circuit 231 is brought into the off-state, and the switch circuit 232 is brought into the on-state. As a result, the voltage Vset2 is output as the set voltage Vset. In this manner, it is possible at all times to output the lower of the voltage Vset1 and voltage Vset2 as the set voltage Vset.

6.3 Advantage of Sixth Embodiment

With the configuration mentioned above, the sixth embodiment provides advantages similar to those of the first, second and fifth embodiment.

Furthermore, in this embodiment, the BGR circuit includes a switching circuit. Therefore, the voltage comparison circuit can be simply configured by an operational amplifier and two inverters. An increase in the chip area can therefore be suppressed.

Still further, the voltage comparison circuit can be simple, and the power consumption can be decreased, accordingly.

Furthermore, this embodiment achieves the advantages as described above whether the number of the diodes D1a included in the BGR circuit 206 and the number of the diodes D2a included in the BGR circuit 207 are the same or not. That is, this embodiment achieves the advantages as described above, when the BGR circuit 206 and the BGR circuit 207 satisfy the formula (4) and the formula (5), respectively. More specifically, for example, in order to satisfy the formula (4) and the formula (5), the ratio R11/R31 and the ratio R12/R32 may be set when the number of diodes D1a and the number of diodes D2a are the same as N. Further, for example, in order to satisfy the formula (4) and the formula (5), the number of diodes D1a and the number of diodes D2a may be set.

7. Seventh Embodiment

A semiconductor storage device of a seventh embodiment will be described below. What makes the seventh embodiment different from the first to sixth embodiments is that a node used by each BGR circuit to compare voltages is further provided. Hereinafter, only points different from the first to sixth embodiments will be described.

7.1 Configuration of Vset Generator

Figure 12:
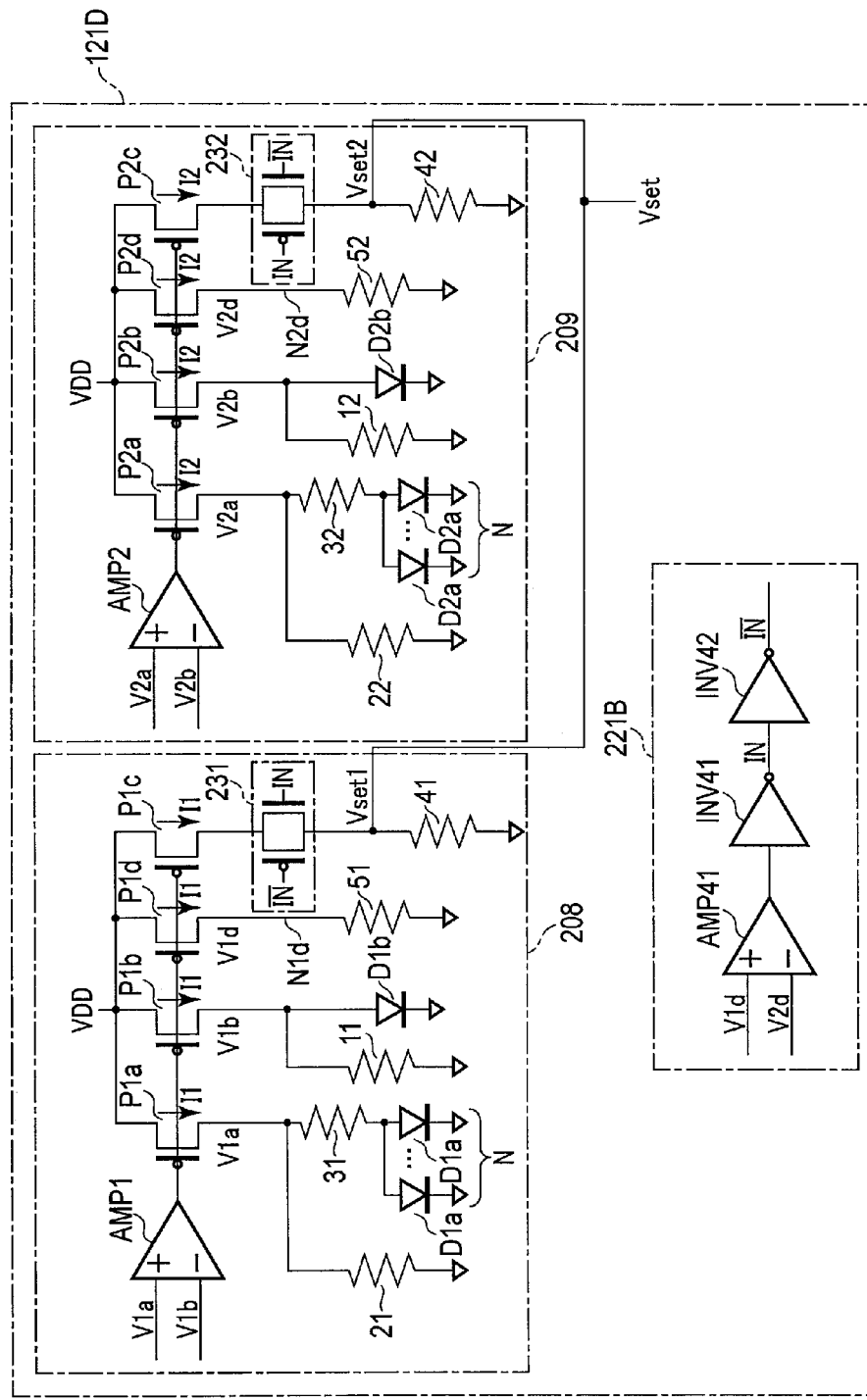
FIG. 12 is a circuit diagram of a Vset generator included in a semiconductor storage device of a seventh embodiment.

A Vset Generator 121D shown in FIG. 12 is a circuit diagram of a Vset generator 121 in this embodiment. The overall configuration of the semiconductor storage device 100 of the seventh embodiment is similar to that shown in FIG. 1 in connection with the first embodiment. The Vset generator 121D of this embodiment includes BGR circuits 208 and 209, and voltage comparison circuit 221B. Relation between the overall configuration shown in FIG. 1 and the Vset generator 121D shown in FIG. 12 was described in the first embodiment; thus, reference to a detailed relation will be omitted.

The BGR circuit 208 is a circuit obtained by further providing a p-channel MOS transistor P1d and resistance element 51 in the BGR circuit 206 described in connection with FIG. 11. In the transistor P1d, a gate thereof is connected to an output terminal of an operational amplifier AMP1, a voltage VDD is input to a source thereof, and a drain thereof is connected to a node N1d. The resistance element 51 is connected between the node N1d and ground node.

The BGR circuit 209 is a circuit obtained by further providing a p-channel MOS transistor P2d and resistance element 52 in the BGR circuit 207 described in connection with FIG. 11. Connections of the transistor P2d and resistance element 52 are identical to the BGR circuit 208. Further, the sizes of the eight transistors P1a to P1d and P2a to P2d are identical, and the resistance values of the resistance elements 51 and 52 are identical.

In the voltage comparison circuit 221B in this embodiment, a voltage V1d of a node N1d of the BGR circuit 208 is input to a non-inverting input terminal, and a voltage V2d of a node N2d of the BGR circuit 209 is input to an inverting input terminal. Further, an output of the inverter INV41 becomes a signal IN, and an output of the inverter INV42 becomes a signal /IN.

7.2 Output Operation of Set Voltage Vset

Next, output of the voltage Vset in this embodiment will be specifically described below. First, when the voltage Vset1 is lower than the voltage Vset2, i.e., when the current I1 is smaller than the current I2, the voltage V1d becomes lower than the voltage V2d because the resistance values of the resistance element 51 and resistance element 52 are identical. Accordingly, the output of the operational amplifier AMP41 is brought to the "L" level, the output of the inverter INV41 is brought to the "H" level, and the output of the inverter INV42 is brought to the "L" level. That is, the signal IN is brought to the "H" level and the signal /IN is brought to the "L" level, and hence the switch circuit 231 is brought into the on-state and the switch circuit 232 is brought into the off-state. As a result, the voltage Vset1 is output as the set voltage Vset.

On the other hand, when the voltage Vset1 is higher than the voltage Vset2, the voltage V1d becomes higher than the voltage V2d, and hence the signal IN is brought to the "L" level and the signal /IN is brought to the "H" level. Accordingly, the switch circuit 231 is brought into the off-state and the switch circuit 232 is brought into the on-state. As a result, the voltage Vset2 is output as the set voltage Vset. In this manner, it is possible at all times to output the lower of the voltage Vset1 and voltage Vset2 as the set voltage Vset.

7.3 Advantage of Seventh Embodiment

With the configuration mentioned above, the seventh embodiment provides advantages similar to those of the first, second, fifth and sixth embodiments.

Furthermore, in this embodiment, the BGR circuit includes a node used when the voltage comparison circuit compares voltages. Therefore, it is possible to decrease the influence of the noise occurred by the voltage comparison circuit on the output of BGR circuit. The Vset generator can output a low noise voltage Vset.

Furthermore, this embodiment achieves the advantages as described above whether the number of the diodes D1a included in the BGR circuit 208 and the number of the diodes D2a included in the BGR circuit 209 are the same or not. That is, this embodiment achieves the advantages as described above, when the BGR circuit 208 and the BGR circuit 208 satisfy the formula (4) and the formula (5), respectively. More specifically, for example, in order to satisfy the formula (4) and the formula (5), the ratio R11/R31 and the ratio R12/R32 may be set when the number of diodes D1a and the number of diodes D2a are the same as N. Further, for example, in order to satisfy the formula (4) and the formula (5), the number of diodes D1a and the number of diodes D2a may be set.

8. Modification Examples

The semiconductor storage device according to the aforementioned embodiments includes a memory cell (MC in FIG. 1) including a variable resistance element (VR in FIG. 1), a bit line (BL in FIG. 1) coupled to the memory cell, and a first circuit (121 in FIG. 1) applying a first voltage (Vset in FIG. 3) to the bit line in a write operation for the memory cell. When a temperature of the variable resistance element is lower than or equal to a first temperature, a temperature coefficient of the first voltage is 0. When the temperature of the variable resistance element is higher than the first temperature, the temperature coefficient of the first voltage is negative.

By applying the embodiments, it is possible to provide a semiconductor storage device capable of improving the reliability. It should be noted that the embodiment is not limited to the aforementioned embodiments, and may be variously modified.

For example, in each of the aforementioned embodiments, a memory cell using an MOS transistor as a selection element may be employed. Such an example is shown in FIG. 13.

Figure 13:
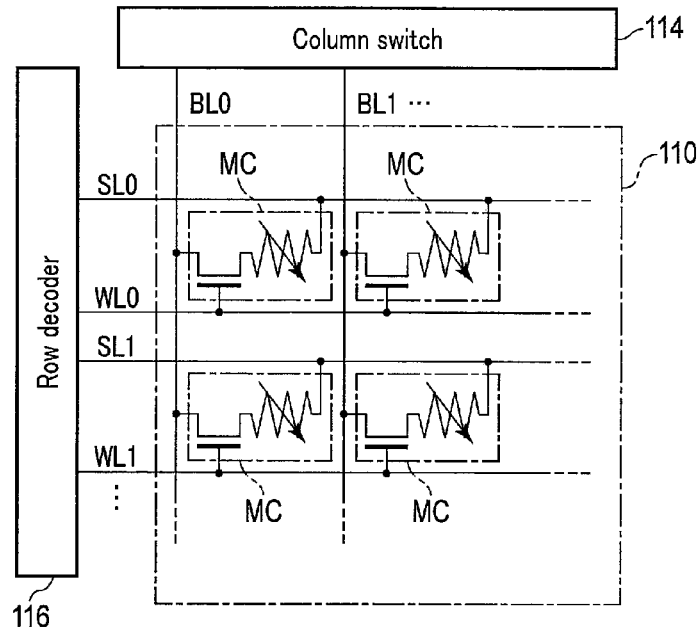
FIG. 13 is a block diagram showing a modification example of a memory cell array included in the semiconductor storage device of the first embodiment.

FIG. 13 is a block diagram showing a modification example of the memory cell array 110. Memory cells arranged on the same column are connected to a certain bit line BL (BL0, BL1, . . . ) as a common connection. Memory cells arranged on the same row are connected to a certain source line SL (SL0, SL1, . . . ), and a certain word line WL (WL0, WL1, . . . ) as a common connection. The memory cell MC includes a variable resistance element VR and transistor connected in series. The variable resistance element VR is connected to a source line SL at one end thereof and is connected to one of a source and drain of the transistor at the other end thereof. The transistor functions as a transfer gate transistor, a gate thereof is connected to a word line WL, and other of a source and drain thereof is connected to a bit line BL. The bit line BL is connected to a column switch 114, and the source line SL and the word line WL are connected to a row decoder 116. In the write or read operation, the row decoder 116 applies a voltage VSS to, for example, all the source lines SL, brings a selected word line WL to the "H" level, and brings a transistor of a memory cell MC of a target row into the on-state. In this state, in the memory cell MC, writing and reading of data are carried out through a corresponding bit line BL.

Furthermore, in each of the aforementioned embodiments, although a case where the set voltage Vset has no temperature dependence at temperatures lower than or equal to a certain temperature and has negative temperature dependence at temperatures higher than the temperature has been described, the temperature characteristics of the BGR circuit may be appropriately changed according to the characteristics of the variable resistance element VR. Such an example is shown in FIG. 14.

Figure 14:
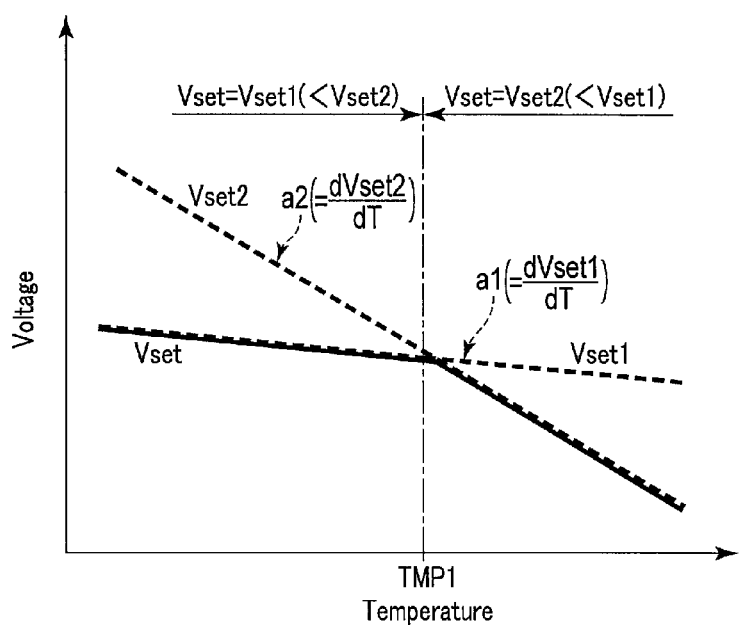
FIG. 14 is a graph showing a modification example of temperature dependence of the set voltage in the semiconductor storage device of the first embodiment.

FIG. 14 is a graph showing a modification example of temperature dependence of the set voltage. In the example of FIG. 14, the set voltage Vset has two types of negative temperature dependence differing from each other according to the temperature. More specifically, voltage Vset1 and voltage Vset2 each have a negative temperature dependence, and the absolute value of gradient a1 (=dVset1/dT) of voltage Vset1 is smaller than the absolute value of gradient a2 (=dVset2/dT) of voltage Vset2 (|a1|<|a2|). In this case, it is sufficient if the ratio R11/R31 and the ratio R12/R32 are set in such a manner that in, for example, the formula (4), the expression is changed to $(R11/R31) \cdot (k/q) \cdot \ln N < 2[mV]$ and $(R12/R32) \cdot (k/q) \cdot \ln N < 2[mV]$, and the relationship $(R11/R31) > (R12/R32)$ is satisfied.

In the aforementioned embodiments, operational amplifiers AMP1, AMP2, AMP31 and AMP32 may have such a configuration as shown in FIG. 15. FIG. 15 shows an example of a circuit diagram of operational amplifiers AMP1, AMP2, AMP31 and AMP32. The operational amplifier of this example includes n-channel MOS transistors 50-52, and p-channel MOS transistors 53 and 54. The gate of transistor 51 is connected as a non-inverting input terminal. The gate of transistor 52 is connected as an inverting input terminal. A power-supply voltage VDD is applied to the sources of transistors 53 and 54. A voltage at a node connecting the drain of transistor 54 and the drain of transistor 52 is output.

In aforementioned embodiments, operational amplifiers AMP51 and AMP 52 may have such a configuration as shown in FIG. 16. FIG. 16 shows an example of a circuit diagram of operational amplifiers AMP51 and AMP52. The operational amplifier of this example includes n-channel MOS transistors 50 and 61 and p-channel MOS transistors 62-64. The gate of transistor 62 is connected as a non-inverting input terminal. The gate of transistor 63 is connected as an inverting input terminal. A power-supply voltage VDD is applied to the sources of transistors 62 and 63 by way of transistor 64. A voltage at a node connecting the drain of transistor 63 and the drain of transistor 61 is output.

The configuration shown in FIG. 16 has an inverted configuration from the configuration shown in FIG. 15, in which both p-channel MOS transistors and n-channel MOS transistors are interchanged with each other. In this case, the gates of transistor 60 and 61 are applied with an output voltage. Since the transistor 60 and 61 are set in the OFF state, an input current (voltage) of the operational amplifier has to be controlled by the transistor 64 and the sources of transistor 60 and 61 have to be grounded.

Further, for example, the voltage Vset1 may have a positive temperature dependence. In this case, it is sufficient if the ratio R11/R31 satisfying the relationship (R11/R31)·(k/q)·1nN>2[mV] in the formula (4) is set. Further, for example, when the variable resistance element VR has three or more types of temperature dependence according to the temperature, the Vset generator 121 may include three or more BGR circuits corresponding to the types of temperature dependence. Regarding the reset current Irst and reference voltage Vref, the number of BGR circuits and their temperature characteristics may be appropriately changed according to the characteristics of the variable resistance element VR.

Furthermore, the BGR circuits of the aforementioned embodiments are only examples, and BGR circuits of different circuit configurations may also be used.

Furthermore, in the aforementioned embodiments, although p-channel MOS transistors have been used in the BGR circuits or in the voltage selection circuit 220, re-channel MOS transistors may also be used.

Furthermore, in each of the BGR circuits of the aforementioned embodiments, the number of diodes connected in parallel may be different in each BGR circuit.

Furthermore, each of the aforementioned embodiments may be separately implemented, and a plurality of embodiments may be combined with each other. For example, only the Irst generator in the aforementioned embodiment may be applied, and the aforementioned embodiment may not be applied to the Vset generator and Vref generator. Further, for example, only the Irst generator and the Vrst generator in the aforementioned embodiment may be applied, and the aforementioned embodiment may not be applied to the Vset generator.

Furthermore, in the aforementioned embodiments, although a description has been made by taking the case where the temperature characteristics of the built-in potential of the diode correspond to −2[mV/° C.] as an example, the value of the temperature characteristics is not limited to this value, and various values may be employed according to the characteristics of the diode. Further, in the formula (4) described previously, it is sufficient if the following condition is satisfied.

$$(R11/R31)\cdot(k/q)\cdot\ln N = (dV1b/dT)$$

However, the formula (4) does not necessarily require strict coincidence, and allows an error of a certain degree. That is, even when the value on the left-hand side of the formula (4) differs from the value on the right-hand side, the difference is allowed as an error if the error is within a range in which a normal operation of the iPCM can be obtained. Naturally, the range within which the operation is regarded as a normal operation may be appropriately changed for each product or the like.

The aforementioned embodiments are also applicable to a phase change random access memory (PRAM or PCM (phase change memory)), resistance random access memory (ReRAM), ferroelectric NAND-type memory (FeNAND), magnetic random access memory (MRAM), conductive bridging RAM (CBRAM), and vacancy-modulated conductive oxide resistive RAM (VMCO-RRAM). Furthermore, the aforementioned embodiments are applicable to various types of storage devices requiring a voltage having a positive or negative temperature dependence.

Furthermore, the terms "connect" and "couple" in the aforementioned embodiments also include a state where a connection is indirectly made with the intervention of something such as a transistor, resistor or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell including a variable resistance element;
   a bit line coupled to the memory cell; and
   a first circuit configured to apply a first voltage to the bit line in a write operation for the memory cell,
   wherein:
   when a temperature of the variable resistance element is lower than or equal to a first temperature value, a temperature coefficient of the first voltage is 0, and
   when the temperature of the variable resistance element is higher than the first temperature value, the temperature coefficient of the first voltage is negative.

2. The device according to claim 1, wherein the first circuit includes:
   a first voltage generator configured to generate a second voltage, a temperature coefficient of the second voltage being 0; and
   a second voltage generator configured to generate a third voltage, a temperature coefficient of the third voltage being negative,
   wherein:
   the first circuit is configured to apply a lower one of the second voltage and the third voltage as the first voltage in the write operation, and
   the second voltage is equal to the third voltage when the temperature of the variable resistance element is at the first temperature value.

3. The device according to claim 1, wherein the first voltage is applied to the memory cell when a state of the variable resistance element is changed from a high resistance state to a low resistance state.

4. The device according to claim 1, wherein the variable resistance element is an interfacial phase change memory element (iPCM element) or a super lattice phase-change element.

5. The device according to claim 2, wherein:
   the first voltage generator includes a first bandgap reference (BGR) circuit configured to generate the second voltage, and
   the second voltage generator includes a second BGR circuit configured to generate the third voltage.

6. The device according to claim 2, wherein:
   the first circuit further includes a voltage selection circuit configured to select the lower one of the second voltage and the third voltage, the voltage selection circuit includes:
   a first transistor of a first conductivity type in which a power-supply voltage is applied to a source;
   a second transistor of the first conductivity type in which a source is coupled to a drain of the first transistor and a drain is coupled to a first interconnect;
   a first operational amplifier configured to compare the second voltage with a voltage of the first interconnect, and apply a voltage corresponding to a comparison result by the first operational amplifier to a gate of the first transistor;
   a second operational amplifier configured to compare the third voltage with the voltage of the first interconnect, and apply a voltage corresponding to a comparison result by the second operational amplifier to a gate of the second transistor; and
   a first resistance element coupled between the first interconnect and a ground node, and
the first circuit is configured to output the voltage of the first interconnect as the first voltage.

7. The device according to claim 2, wherein:
the first circuit includes a voltage selection circuit configured to select the lower one of the second voltage and the third voltage,
the voltage selection circuit includes:
   a first transistor of a first conductivity type in which a drain is coupled to a first interconnect and a source is applied with a ground voltage;
   a second transistor of the first conductivity type in which a drain is coupled to the first interconnect and a source is applied with the ground voltage;
   a first operational amplifier configured to compare the second voltage with a voltage of the first interconnect and apply a voltage corresponding to a comparison result by the first operational amplifier to a gate of the first transistor;
   a second operational amplifier configured to compare the third voltage with the voltage of the first interconnect and apply a voltage corresponding to a comparison result by the second operational amplifier to a gate of the second transistor;
   a first resistance element coupled between the first interconnect and a power supply node, and
the first circuit is configured to output the voltage of the first interconnect as the first voltage.

8. The device according to claim 2, wherein the second voltage generator includes:
   a first BGR circuit configured to generate a first current, a temperature coefficient of the first current being 0; and
   a second BGR circuit configured to generate a second current, a temperature coefficient of the second current being negative, and
   wherein the second voltage generator is configured to generate the third voltage based on a sum of the first current and the second current.

9. The device according to claim 5, wherein the first BGR circuit includes:
   a first transistor of a first conductivity type in which a power-supply voltage is applied to a source, and a drain is coupled to a first interconnect;
   a second transistor of the first conductivity type in which the power-supply voltage is applied to a source, and a drain is coupled to a second interconnect;
   a third transistor of the first conductivity type in which the power-supply voltage is applied to a source, and a drain is coupled to a third interconnect;
   a first operational amplifier configured to compare a voltage of the first interconnect with a voltage of the second interconnect, and apply a fourth voltage corresponding to a comparison result by the first operational amplifier to gates of the first to third transistors;
   a first diode in which an anode is coupled to the first interconnect, and a cathode is coupled to a ground node;
   N (N is an integer greater than or equal to 2) second diodes in which cathodes are coupled to the ground node and anodes are coupled to each other;
   a first resistance element coupled between the first interconnect and the ground node;
   a second resistance element coupled between the second interconnect and the ground node;
   a third resistance element coupled between the third interconnect and the ground node; and
   a fourth resistance element coupled between the second interconnect and the anodes of the N second diodes, and
   wherein the first BGR circuit is configured to output a voltage of the third interconnect as the second voltage.

10. The device according to claim 9, wherein, when a temperature characteristic value of a built-in potential of the second diode is −2[mV/° C.],
a resistance value of the first resistance element is R1, and
a resistance value of the fourth resistance element is R3,
a following relationship is established:

$(R1/R3) \cdot (k/q) \cdot \ln N = 2[\text{mV}]$, wherein k is a Boltzmann constant and q is a charge amount of electrons.

11. The device according to claim 9, wherein the second BGR circuit includes:
   a fourth transistor of the first conductivity type in which the power-supply voltage is applied to a source, and a drain is coupled to fourth interconnect;
   a fifth transistor of the first conductivity type in which the power-supply voltage is applied to a source, and a drain is coupled to fifth interconnect;
   a sixth transistor of the first conductivity type in which the power-supply voltage is applied to a source, and a drain is coupled to sixth interconnect;
   a second operational amplifier configured to compare a voltage of the fourth interconnect with a voltage of the fifth interconnect, and apply a fifth voltage corresponding to a comparison result by the second operational amplifier to gates of the fourth to sixth transistors;
   a third diode in which an anode is coupled to the fourth interconnect and a cathode is coupled to the ground node;
   M (M is an integer greater than or equal to 2) fourth diodes in which cathodes are coupled to the ground node and anodes are coupled to each other;
   a fifth resistance element coupled between the fourth interconnect and the ground node;
   a sixth resistance element coupled between the fifth interconnect and the ground node;
   a seventh resistance element coupled between the sixth interconnect and the ground node; and
   an eighth resistance element coupled between the fifth interconnect and the anodes of the M fourth diodes, and
   wherein the second BGR circuit is configured to output a voltage of the sixth interconnect as the third voltage.

12. The device according to claim 11, wherein, when a temperature characteristic value of a built-in potential of the fourth diode is −2[mV/° C.],
a resistance value of the fourth resistance element is R1, and
a resistance value of the sixth resistance element is R3, a following relationship is established:

$$(R1/R3)\cdot(k/q)\cdot\ln M < 2\text{[mV]}$$

wherein k is a Boltzmann constant and q is a charge amount of electrons.

13. The device according to claim 11, wherein the first circuit is configured to:
compare the fourth voltage with the fifth voltage,
apply the second voltage as the first voltage when the fourth voltage is higher than the fifth voltage, and
apply the third voltage as the first voltage when the fourth voltage is lower than the fifth voltage.

14. The device according to claim 11, wherein the first voltage generator further includes:
a seventh transistor of the first conductivity type in which the power-supply voltage is applied to a source, the fourth voltage is applied to a gate, and a drain is coupled to a seventh interconnect; and
a ninth resistance element coupled between the seventh interconnect and the ground node,
wherein the second voltage generator further includes:
an eighth transistor of the first conductivity type in which the power-supply voltage is applied to a source, the fifth voltage is applied to a gate, and a drain is coupled to an eighth interconnect; and
a tenth resistance element coupled between the eighth interconnect and the ground node, and
wherein the first circuit is configured to:
compare a voltage of the seventh interconnect with a voltage of the eighth interconnect,
apply the second voltage as the first voltage when the voltage of the seventh interconnect is lower than the voltage of the eighth interconnect, and
apply the third voltage as the first voltage when the voltage of the seventh interconnect is higher than the voltage of the eighth interconnect.

15. A semiconductor storage device comprising:
a memory cell including a variable resistance element;
a bit line coupled to the memory cell; and
a first circuit configured to apply a first current to the bit line in a write operation for the memory cell, a temperature coefficient of the first current being negative,
wherein the first current flows through the memory cell when a state of the variable resistance element is changed from a low resistance state to a high resistance state.

16. The device according to claim 15, wherein the variable resistance element is an interfacial phase change memory element (iPCM element) or a super lattice phase-change element.

17. The device according to claim 15, wherein the first circuit includes:
a first BGR circuit configured to generate a second current, a temperature coefficient of the second current being 0; and
a second BGR circuit configured to generate a third current, a temperature coefficient of the third current being negative, and
wherein the first circuit is configured to apply a sum of the second current and the third current as the first current.

18. A semiconductor storage device comprising:
a memory cell including a variable resistance element;
a bit line coupled to the memory cell;
a sense amplifier coupled to the bit line; and
a first circuit configured to apply a first reference voltage to the sense amplifier in a reading operation for the memory cell, a temperature coefficient of the first reference voltage being negative,
wherein, in the reading operation for the memory cell, the temperature coefficient of the first reference voltage is lower than a temperature coefficient of a first voltage of the bit line obtained when the variable resistance element is in a high resistance state, and is higher than a temperature coefficient of a second voltage of the bit line obtained when the variable resistance element is in a low resistance state.

19. The device according to claim 18, wherein in the reading operation for the memory cell, the first reference voltage is approximately equal to a mean value of the first voltage and the second voltage.

20. The device according to claim 19, wherein the variable resistance element is an interfacial phase change memory element (iPCM element) or a super lattice phase-change element.

21. A semiconductor storage device comprising:
a memory cell including a variable resistance element;
a bit line coupled to the memory cell; and
a first circuit configured to apply a first voltage to the bit line in a write operation for the memory cell,
wherein:
the first voltage has a first voltage value when a temperature of the semiconductor storage device is a second temperature value, the second temperature value being lower than a first temperature value,
the first voltage has a second voltage value when the temperature of the semiconductor storage device is a third temperature value, the third temperature value being higher than the second temperature value by a given value, and the third temperature value being lower than the first temperature value,
the first voltage has a third voltage value when the temperature of the semiconductor storage device is a fourth temperature value, the fourth temperature value being higher than the first temperature value,
the first voltage has a fourth voltage value when the temperature of the semiconductor storage device is a fifth temperature value, the fifth temperature value being higher than the fourth temperature value by the given value, and
a difference between the first voltage value and the second voltage value is smaller than a difference between the third voltage value and the fourth voltage value.

22. The device according to claim 21, wherein the difference between the first voltage value and the second voltage value is 0.

23. The device according to claim 21, wherein:
the first circuit includes:
a first voltage generator configured to generate a second voltage; and
a second voltage generator configured to generate a third voltage, a temperature coefficient of the third voltage being lower than a temperature coefficient of the second voltage,
the first circuit is configured apply a lower one of the second voltage and the third voltage as the first voltage in the write operation, and the second voltage is equal to the third voltage when the temperature of the semiconductor storage device is at the first temperature value.

24. The device according to claim 23, wherein:
the first voltage generator includes a first bandgap reference (BGR) circuit configured to generate the second voltage, and
the second voltage generator includes a second BGR circuit configured to generate the third voltage.

25. The device according to claim 24, wherein the first BGR circuit includes:
a first transistor of a first conductivity type in which a power-supply voltage is applied to a source, and a drain is coupled to a first interconnect;
a second transistor of the first conductivity type in which the power-supply voltage is applied to a source, and a drain is coupled to a second interconnect;
a third transistor of the first conductivity type in which the power-supply voltage is applied to a source, and a drain is coupled to a third interconnect;
a first operational amplifier configured to compare a voltage of the first interconnect with a voltage of the second interconnect, and apply a fourth voltage corresponding to a comparison result by the first operational amplifier to gates of the first to third transistors;
a first diode in which an anode is coupled to the first interconnect, and a cathode is coupled to a ground node;
N (N is an integer greater than or equal to 2) second diodes in which cathodes are coupled to the ground node and anodes are coupled to each other;
a first resistance element coupled between the first interconnect and the ground node;
a second resistance element coupled between the second interconnect and the ground node;
a third resistance element coupled between the third interconnect and the ground node; and
a fourth resistance element coupled between the second interconnect and the anodes of the N second diodes, and
wherein the first BGR circuit is configured to output a voltage of the third interconnect as the second voltage.

26. The device according to claim 25, wherein, when a temperature characteristic value of a built-in potential of the second diode is −2[mV/° C.],
a resistance value of the first resistance element is R1, and
a resistance value of the fourth resistance element is R3, a following relationship is established:

$$(R1/R3) \cdot (k/q) \cdot \ln N = 2[\text{mV}],$$

wherein k is a Boltzmann constant and q is a charge amount of electrons.

27. The device according to claim 25, wherein the second BGR circuit includes:
a fourth transistor of the first conductivity type in which the power-supply voltage is applied to a source, and a drain is coupled to fourth interconnect;
a fifth transistor of the first conductivity type in which the power-supply voltage is applied to a source, and a drain is coupled to fifth interconnect;
a sixth transistor of the first conductivity type in which the power-supply voltage is applied to a source, and a drain is coupled to sixth interconnect;
a second operational amplifier configured to compare a voltage of the fourth interconnect with a voltage of the fifth interconnect, and apply a fifth voltage corresponding to a comparison result by the second operational amplifier to gates of the fourth to sixth transistors;
a third diode in which an anode is coupled to the fourth interconnect and a cathode is coupled to the ground node;
M (M is an integer greater than or equal to 2) fourth diodes in which cathodes are coupled to the ground node and anodes are coupled to each other;
a fifth resistance element coupled between the fourth interconnect and the ground node;
a sixth resistance element coupled between the fifth interconnect and the ground node;
a seventh resistance element coupled between the sixth interconnect and the ground node; and
an eighth resistance element coupled between the fifth interconnect and the anodes of the M fourth diodes, and
wherein the second BGR circuit is configured to output a voltage of the sixth interconnect as the third voltage.

28. The device according to claim 27 wherein, when a temperature characteristic value of a built-in potential of the fourth diode is −2[mV/° C.],
a resistance value of the fourth resistance element is R1, and
a resistance value of the sixth resistance element is R3, a following relationship is established:

$$(R1/R3) \cdot (k/q) \cdot \ln M < 2[\text{mV}]$$

wherein k is a Boltzmann constant and q is a charge amount of electrons.

29. The device according to claim 27, wherein the first circuit is configured to compare the fourth voltage with the fifth voltage, apply the second voltage as the first voltage when the fourth voltage is higher than the fifth voltage, and apply the third voltage as the first voltage when the fourth voltage is lower than the fifth voltage.

30. The device according to claim 27, wherein the first voltage generator further includes:
a seventh transistor of the first conductivity type in which the power-supply voltage is applied to a source, the fourth voltage is applied to a gate, and a drain is coupled to a seventh interconnect; and
a ninth resistance element coupled between the seventh interconnect and the ground node,
wherein the second voltage generator further includes:
an eighth transistor of the first conductivity type in which the power-supply voltage is applied to a source, the fifth voltage is applied to a gate, and a drain is coupled to an eighth interconnect; and
a tenth resistance element coupled between the eighth interconnect and the ground node, and
wherein the first circuit is configured to:
compare a voltage of the seventh interconnect with a voltage of the eighth interconnect,
apply the second voltage as the first voltage when the voltage of the seventh interconnect is lower than the voltage of the eighth interconnect, and
apply the third voltage as the first voltage when the voltage of the seventh interconnect is higher than the voltage of the eighth interconnect.

31. The device according to claim 23, wherein:
the first circuit further includes a voltage selection circuit configured to select the lower one of the second voltage and the third voltage,
the voltage selection circuit includes:
a first transistor of a first conductivity type in which a power-supply voltage is applied to a source;

a second transistor of the first conductivity type in which a source is coupled to a drain of the first transistor and a drain is coupled to a first interconnect;

a first operational amplifier configured to compare the second voltage with a voltage of the first interconnect, and apply a voltage corresponding to a comparison result by the first operational amplifier to a gate of the first transistor;

a second operational amplifier configured to compare the third voltage with the voltage of the first interconnect, and apply a voltage corresponding to a comparison result by the second operational amplifier to a gate of the second transistor; and a first resistance element coupled between the first interconnect and a ground node, and the first circuit is configured to output the voltage of the first interconnect as the first voltage.

32. The device according to claim 23, wherein:

the first circuit includes a voltage selection circuit configured to select the lower one of the second voltage and the third voltage, the voltage selection circuit includes:

a first transistor of a first conductivity type in which a drain is coupled to a first interconnect and a source is applied with a ground voltage;

a second transistor of the first conductivity type in which a drain is coupled to the first interconnect and a source is applied with the ground voltage;

a first operational amplifier configured to compare the second voltage with a voltage of the first interconnect and apply a voltage corresponding to a comparison result by the first operational amplifier to a gate of the first transistor;

a second operational amplifier configured to compare the third voltage with the voltage of the first interconnect and apply a voltage corresponding to a comparison result by the second operational amplifier to a gate of the second transistor;

a first resistance element coupled between the first interconnect and a power supply node, and the first circuit is configured to output the voltage of the first interconnect as the first voltage.

33. The device according to claim 23, wherein the second voltage generator includes:

a first BGR circuit configured to generate a first current; and a second BGR circuit configured to generate a second current, a temperature coefficient of the second current being lower than a temperature coefficient of the first current, and wherein the second voltage generator is configured to generate the third voltage based on a sum of the first current and the second current.

34. The device according to claim 21, wherein the first voltage is applied to the memory cell when a state of the variable resistance element is changed from a high resistance state to a low resistance state.

35. The device according to claim 21, wherein the variable resistance element is an interfacial phase change memory element (iPCM element) or a super lattice phase-change element.

* * * * *